United States Patent [19]
MacDonald et al.

[11] Patent Number: 5,770,465
[45] Date of Patent: Jun. 23, 1998

[54] TRENCH-FILLING ETCH-MASKING MICROFABRICATION TECHNIQUE

[75] Inventors: Noel C. MacDonald; Xiaojun Trent Huang; Liang-Yuh Chen, all of Ithaca, N.Y.

[73] Assignee: Cornell Research Foundation, Inc., Ithaca, N.Y.

[21] Appl. No.: 668,378

[22] Filed: Jun. 21, 1996

Related U.S. Application Data

[60] Provisional application No. 60/000,439, Jun. 23, 1995.

[51] Int. Cl.[6] .................................................. H01L 21/76
[52] U.S. Cl. ............................. 437/67; 437/974; 216/2; 216/79
[58] Field of Search ............................. 437/67, 974, 7; 216/7, 79

[56] References Cited

U.S. PATENT DOCUMENTS

| | | | |
|---|---|---|---|
| 4,968,585 | 11/1990 | Albrecht et al. | 216/2 |
| 5,256,592 | 10/1993 | Matsushita | 437/67 |
| 5,273,939 | 12/1993 | Becker . | |
| 5,296,092 | 3/1994 | Kim . | |
| 5,306,659 | 4/1994 | Beyer . | |
| 5,316,979 | 5/1994 | MacDonald . | |
| 5,324,683 | 6/1994 | Fitch . | |
| 5,372,968 | 12/1994 | Lur . | |
| 5,393,375 | 2/1995 | MacDonald . | |
| 5,407,860 | 4/1995 | Stoltz . | |

FOREIGN PATENT DOCUMENTS 40 00 496  2/1991  Germany .

*Primary Examiner*—Trung Dang
*Attorney, Agent, or Firm*—Jones, Tullar & Cooper, P.C.

[57] ABSTRACT

A process is described for manufacturing submicron, ultra-high aspect ratio microstructures using a trench-filling etch masking technique. Deep trenches are etched into a substrate, the trenches are filled with an appropriate trench-filling material, and deep etching into the substrate is carried out with the trench-filling material serving as a mask.

6 Claims, 18 Drawing Sheets

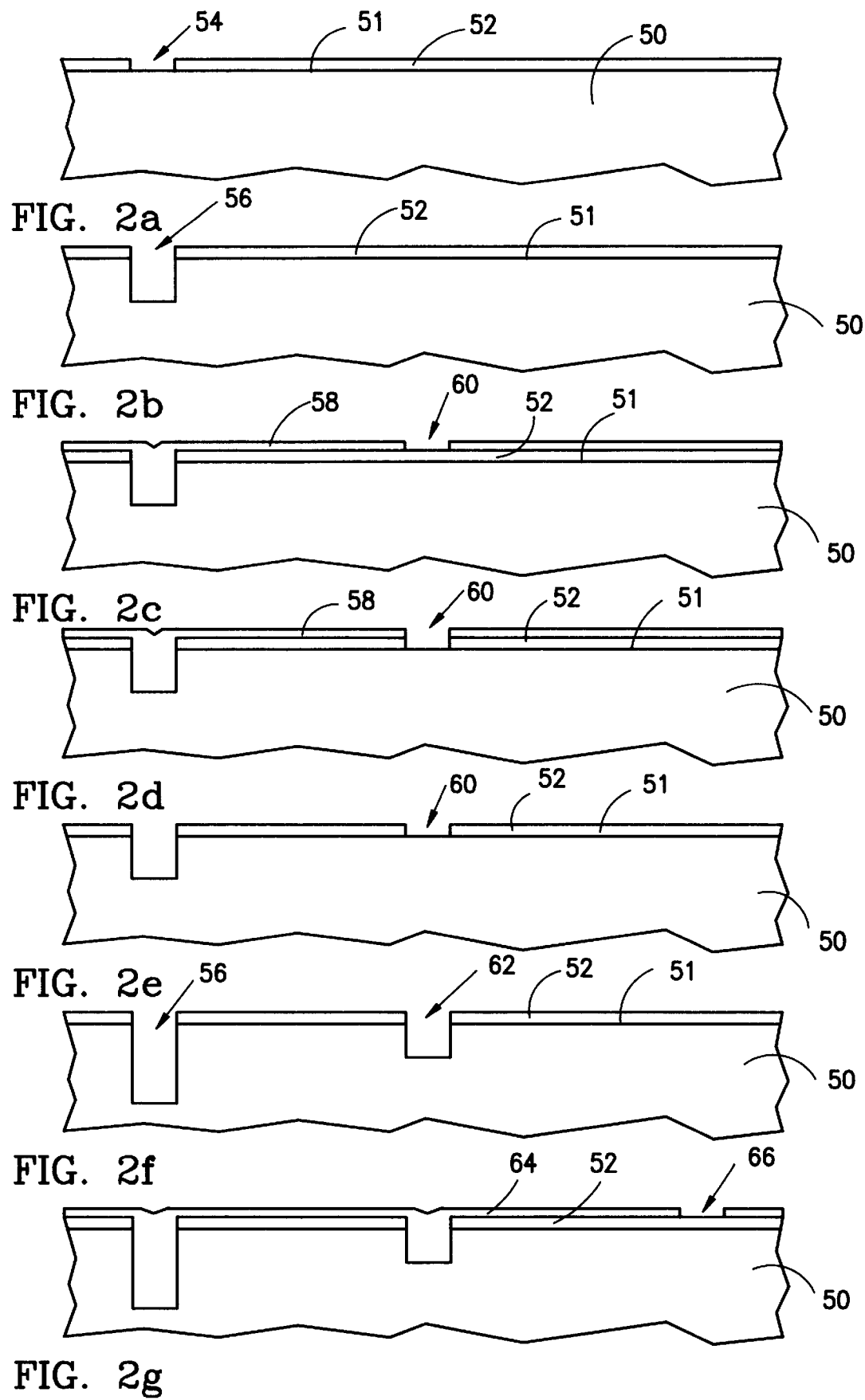

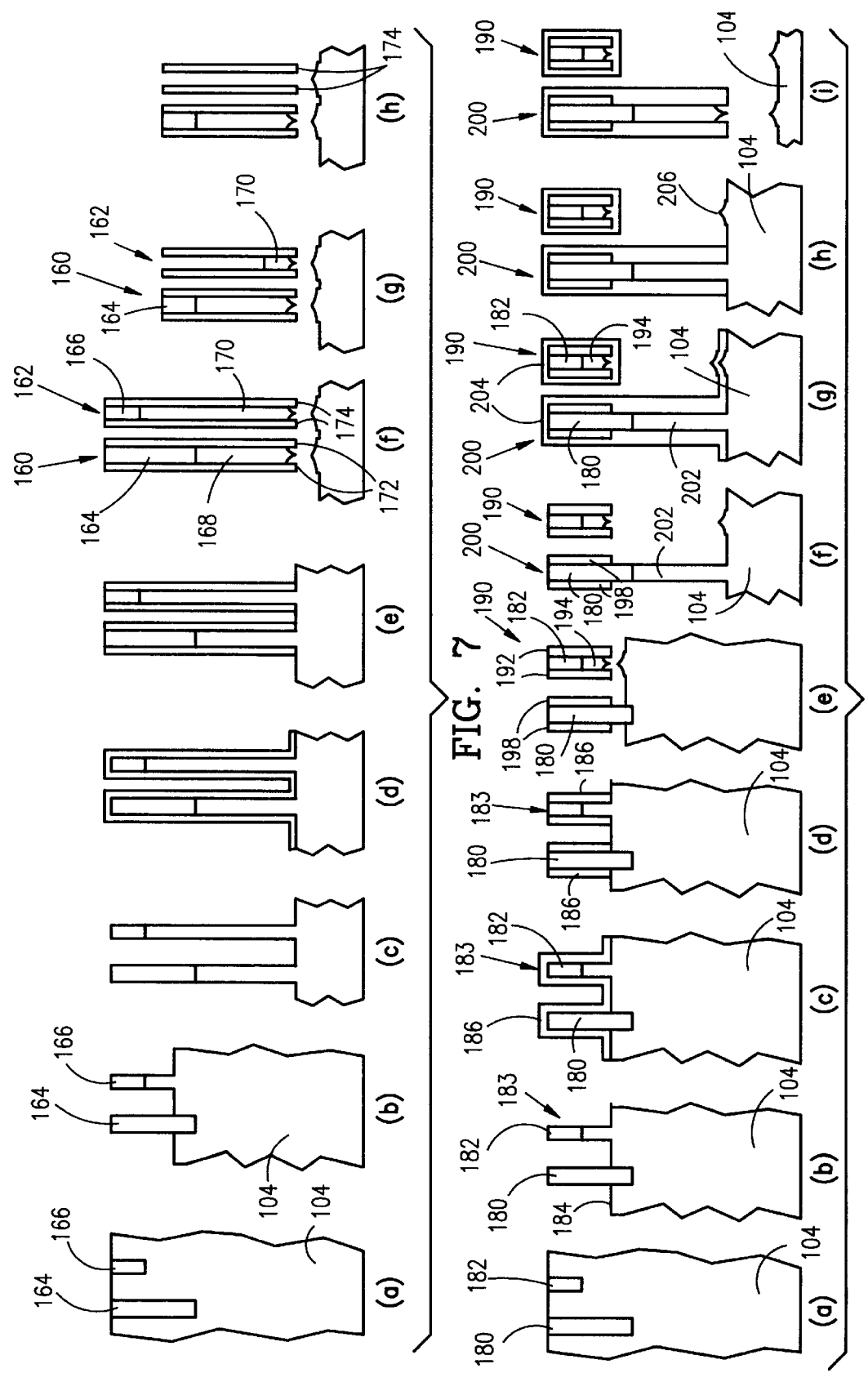

5,770,465

TRENCH-FILLING ETCH-MASKING MICROFABRICATION TECHNIQUE

FIELD OF THE INVENTION

This application claims the benefit of U.S. Provisional Application No. 60/000,439, filed Jun. 23, 1995.

The present invention is directed to a new microfabrication technique which uses trench filling materials as etch masks to achieve a variety of complex-shaped microstructures.

BACKGROUND OF THE INVENTION

The market in MEMS (MicroElectroMechanical systems) is expanding rapidly due to the fast growing number of applications. Consequently, there is an increasing demand for microstructures of various topology (e.g. multiple level, ultra-high aspect ratio (~200:1) structures).

Although significant progress in relevant technologies has been made in recent years, the current feasible range of many important parameters in microstructure designs, such as aspect ratio and the capacity of integrating structures of various heights and aspect ratios on a single chip, is restricted by the inherent limitations of the conventional processing techniques in MEMS. For example, prior art methods using photoresist and/or deposited dielectrics or metals do not provide adequate masking to sustain a lengthy RIE deep silicon etch.

In addition, high aspect ratio (~10:1) released structures with smooth bottoms are essential in many applications. For example high quality micro-gears require such a structure. In the past, they have been fabricated using LIGA process. However, LIGA suffers from the rather complex and expensive lithographic tools involved, as well as the very thick layer deposition required which is very time and money consuming.

Also, there has long been a need for precision three-dimensional micro-actuators. XY actuators have been well characterized and are widely in use. In the past, some Z direction actuation actuators, such as torsional actuators, have been proposed and fabricated. The range as well as the precision of the actuation, however, is unsatisfactory due to the inherent nonlinear nature of these actuators.

SUMMARY OF THE INVENTION

The present invention is a process which provides multiple level, ultra-high aspect ratio (~100:1) microstructures. In addition, the technique can be used to form ultra-high aspect ratio structures having very small gaps between each of the structures. Through use of the present inventive process, multi-level, fine-line (submicron) structures of various height/widths can now be easily fabricated on the same chip.

To produce these structures, the novel concept of using a trench-filling etch-mask opens up an entirely new way of thinking regarding the fabrication of MEMS structures. The use of a trench, filled with an appropriate filling material, results in a mask which is thick enough to allow deep etching into a substrate. The use of SOG (spin-on-glass), previously used for the planarization of trenches in VLSI processing, is extended to produce a high aspect ratio oxide etch mask for the dry etching of single crystal substrates (e.g. silicon or GaAs). For the first time, SOG is used as a trench filling material to produce microelectromechanical systems (MEMS). This low temperature process is used to form very high aspect ratio microstructures with minimal equipment cost, and doesn't require expensive, specially designed deep silicon etching equipment or lithographic tools.

The first step, in accordance with a preferred form of the invention, is to etch deep trenches in a silicon wafer using $Cl_2$ RIE, with the depth of the trenches equal to the desired height of the oxide mask (e.g. 100 microns). A thin 1000 angstrom LTO is deposited to round up the corners of the silicon trenches. Then the trenches are filled with spin coating SOG, having a curing temperature of 425 degrees. Oxide etch-back or micropolishing is used to expose the top surface of the silicon wafer. The SOG-oxide then serves as an etch mask for the deep etching of silicon (e.g. 100 microns). To produce free-standing silicon micromachines, a standard SCREAM (single crystal reactive etching and metallization) process such as that described in copending application Ser. No. 312,797, filed Sep. 27, 1994, is then performed which uses $SF_6$ RIE to provide the undercut.

Although the technique is described in a preferred embodiment as a process using SOG to fill trenches formed in a silicon substrate, other substrates (e.g. GaAs, InP) and trench filling materials (e.g. reflowed silicon oxide, spin-on dielectrics, or metals) can be used.

Many novel devices including XYZ linear actuators, multiple level actuators, on-chip movable grating structures, on-chip movable waveguides, etc., which are either impossible or impractical to form due to the complexity demanded using conventional processing technologies, have now become available, taking advantage of this novel technique. In addition, this technology involves no volumetric expansion, thus the minimum feature size is primarily limited by the lithographic tools used. The process is also very low stress if proper conditions are chosen (e.g., if SOG is chosen to be the trench-filling material, a high carbon content is desirable for achieving low stress).

In addition, through the use of trench-filling etch-masking, micro fabrication can be conducted with generic optical lithographic tools and without a thick layer deposition. The process provides a planar top surface after forming the mask through trench definition and filling, thus providing a convenient platform for subsequent processing steps. Thus, very fine line (submicron) lithography can be carried out. Prior attempts to form high aspect ratio structures resulted in a topology which did not lend itself to additional lithographic processing, i.e. it was not possible to get light down between tall structures after they had been formed.

With respect to specific examples of structures which can now be formed through use of the present technique, high stability linear XYZ microactuators can be fabricated. The process allows the fabrication of supporting springs as well as comb actuators in all directions, thus ensuring linear operation over a large range. In addition, actuators fabricated using this technique are highly stable in all directions, due to their ultra-high aspect ratio.

BRIEF DESCRIPTION OF THE DRAWINGS

The foregoing and additional features and advantages of the present invention will become apparent to those of skill in the art from the following detailed description of the invention, taken in conjunction with the accompanying drawings, in which:

FIGS. 2a–2m illustrate in diagrammatic form the process steps associated with forming mask structures of varying height;

FIGS. 7a–7b illustrate in diagrammatic form the process steps use to form thick, solid structures as well as thin structures;

FIGS. 8a–8i illustrate in diagrammatic form the process steps used to form differently sized structures having multiple sidewall layers;

DETAILED DESCRIPTION OF THE PREFERRED EMBODIMENTS

In accordance with the present invention, a trench-filling etch-masking technique is used to fabricate a variety of complex-shaped microstructures. In a preferred embodiment, this technique is demonstrated using spin-on-glass (SOG) as an etch mask during deep reactive ion etching (RIE) into a single crystal silicon substrate. It should be noted that the process is applicable to the use of a variety of trench filling materials (e.g. reflowed oxide, metals) to fill trenches formed in other substrates (e.g. GaAs).

The process steps used to fill trenches formed in silicon are diagrammatically illustrated in FIGS. 1a through 1k, to which reference is now made. Each of the FIGS. 1a through 1k depicts a cross-sectional view alongside a corresponding three-dimensional view.

Figure 1A:
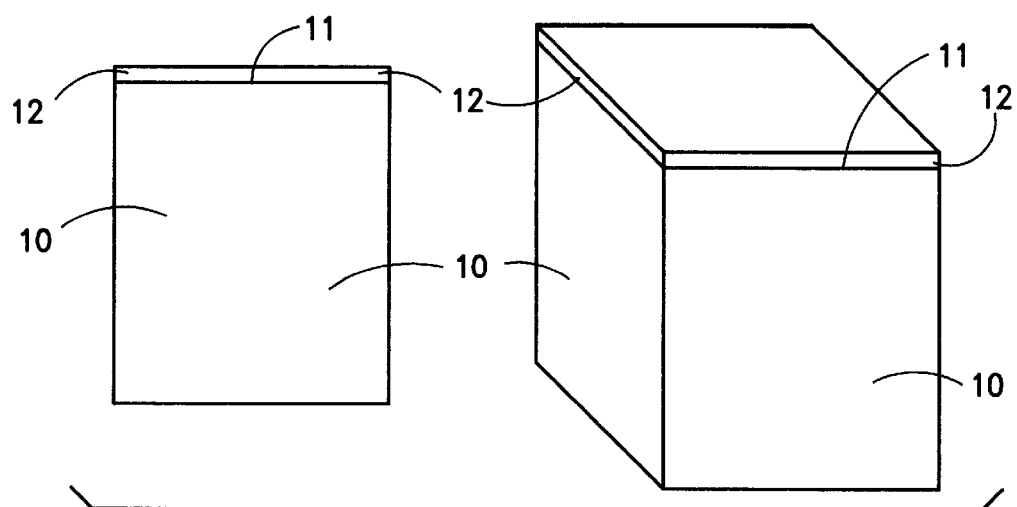
FIGS. 1a–1k illustrate in diagrammatic form the process steps using the novel trench filling mask of the present invention.
Figure 1B:
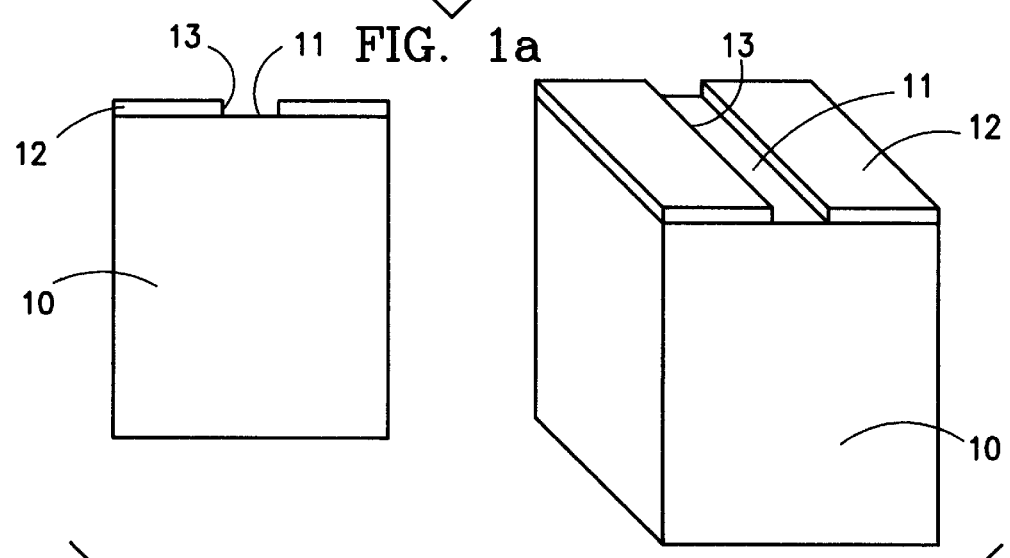

As illustrated in FIGS. 1a, a bare silicon wafer 10 serves as the starting substrate in a preferred form of the invention. Note that other wafers, such as GaAs may be used. A 1.5 Am thick layer of silicon oxide 12 is deposited on the top surface 11 of the wafer through chemical vapor deposition (CVD). The silicon oxide 12 may also be deposited by evaporation or can be thermally grown. The silicon oxide 12 is covered by a photoresist layer and a lithography process is used to expose the photoresist at the desired locations of the trenches. Such processes are well known to those of skill in the art. The oxide 12 is then patterned by dry etching (e.g. $CHF_3$ or $CF_4$ RIE) as at 13 to expose the bare silicon surface 11 where trenches will be formed, resulting in the structure depicted in FIG. 1b.

Figure 1C:
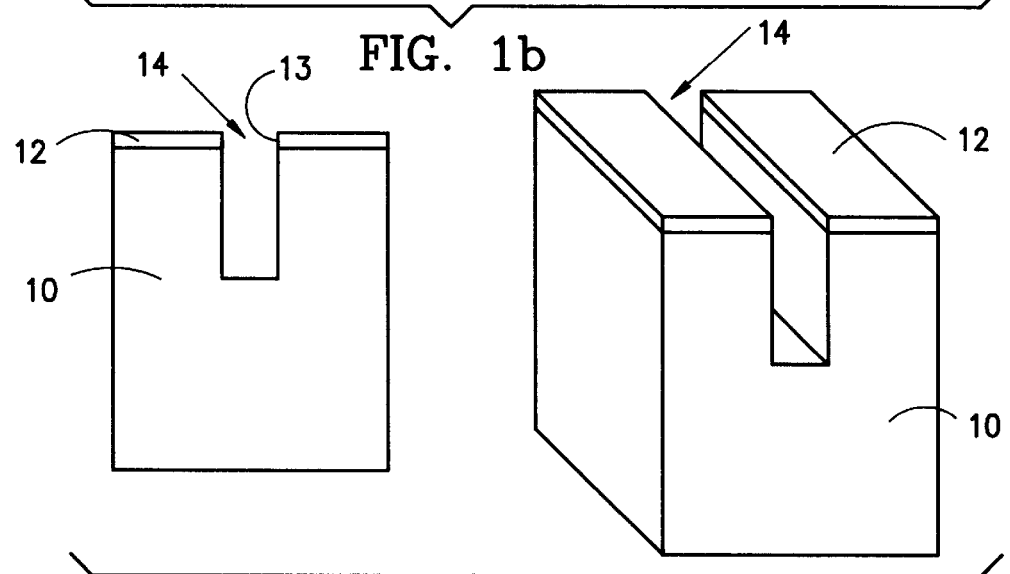

Referring to FIG. 1c, an anisotropic $Cl_2$ RIE is then used to create a 10 μm deep trench 14 in the silicon substrate 10 at the location of pattern 13. An etchant having a high etch selectivity of silicon/oxide is preferred. Trenches are shaped and located depending on the features desired, as determined by the lithography step.

Figure 1D:
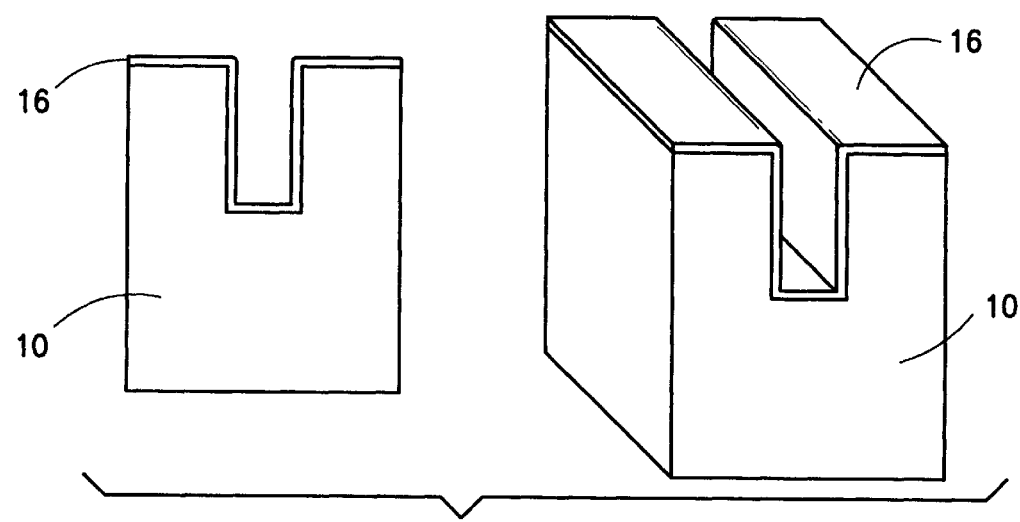

As illustrated in FIG. 1d, the remaining oxide 12 is then removed by $CHF_3$ RIE. Other etching means can be used such as, for example, buffered HF. A conformal layer approximately 1000 Å thick of low temperature CVD oxide 16 is next deposited to round out the sharp corners in the trenches. It should be noted that this step is recommended if spin-on-glass (SOG) will be used to fill the trenches, however, it is unnecessary if other filling mechanisms are used.

As illustrated in FIG. 1d, a layer of spin-on-glass (SOG) 18 is spun on at room temperature, covering oxide layer 16 and filling trench 14. SOG, a low viscosity liquid when applied, will fill trenches whose widths are comparable to the nominal thickness of SOG on the top surface of a substrate. The thickness of SOG on a large open area depends on the specific type of SOG. To fill 1 μm wide trenches, for example, a typical thickness of SOG on the base substrate would be approximately 1 μm. The SOG is then baked, typically on a hotplate at three temperatures, 90° C., 150° C. and 250° C. for two minutes each. The SOG is subsequently cured at approximately 425° C., in a convection oven for 1 hour, forming SOG oxide. As was mentioned above, other filling mechanisms can be used such as, for example, BPSG and PSG. An optional SOG layer can then be spun on to provide further planarization of the top surface of the wafer.

Figure 1E:
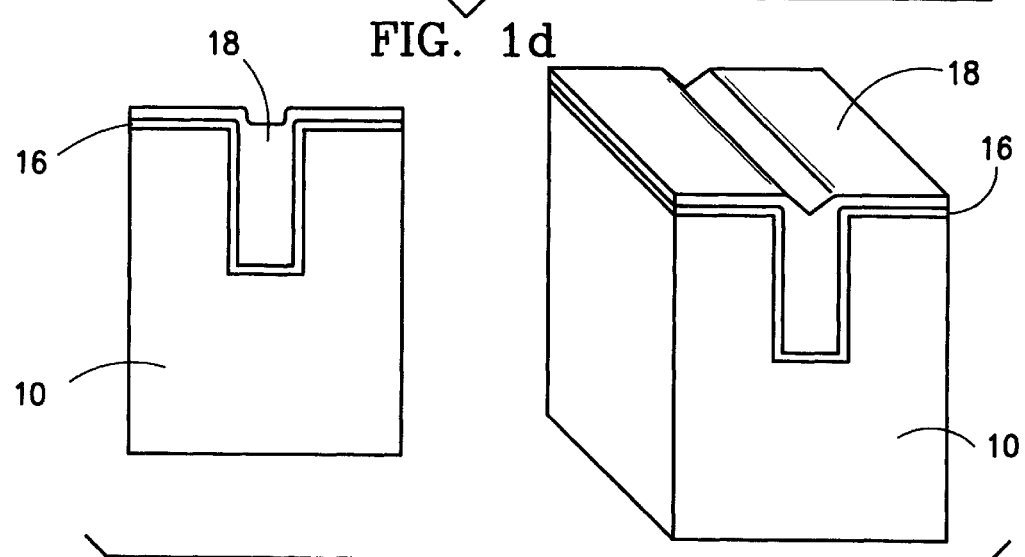
Figure 1F:
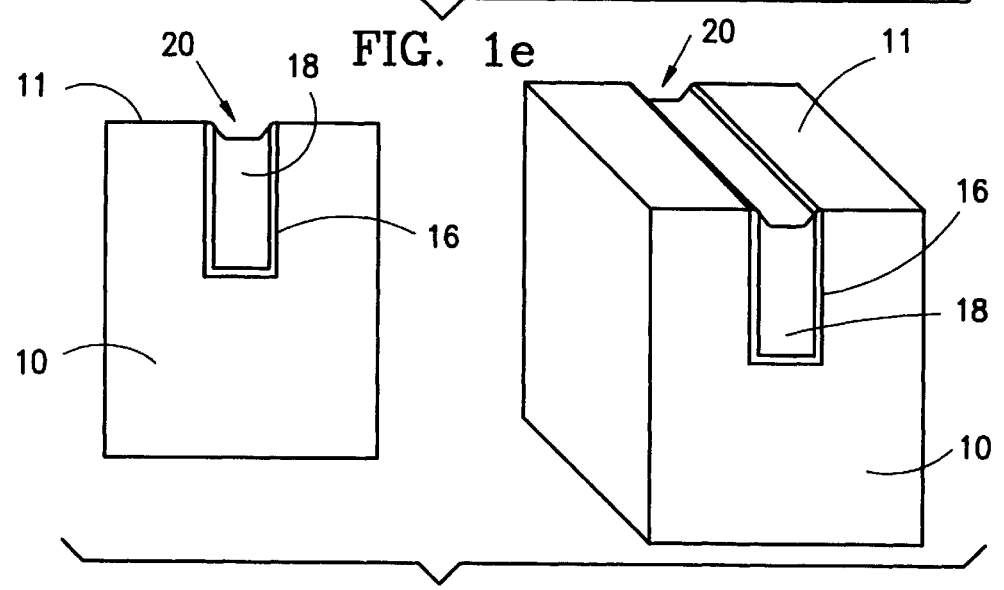

Referring to FIG. 1f, a $CHF_3$ RIE is used to clear away SOG layer 18 and oxide layer 16 on the top surface of silicon substrate 10, leaving an exposed surface 11 and a SOG-filled trench 20. Micromechanical polishing or another etching mechanism may be used, depending on the particular trench filling material.

Figure 1G:
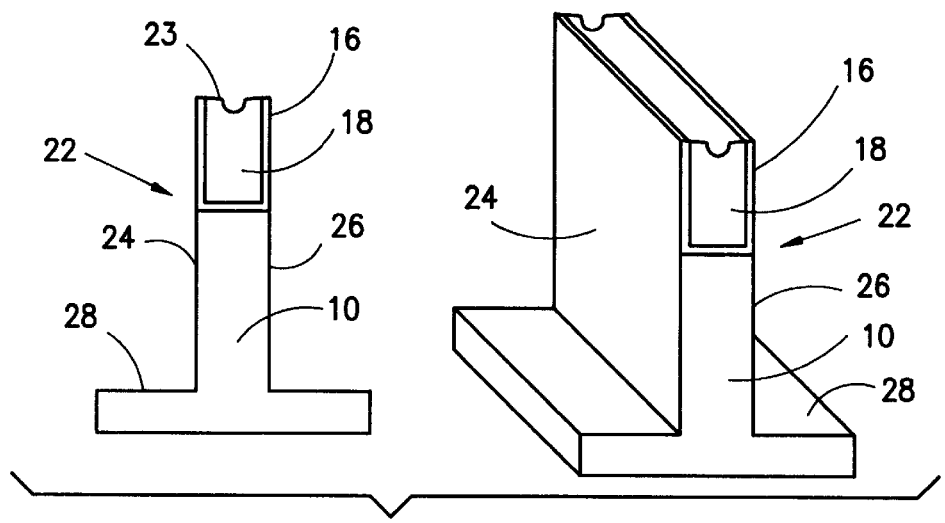

As illustrated in FIG. 1g, a chlorine RIE step is then used to etch deeply into the silicon substrate 10 around the trench 20, to a depth of, for example, 100 microns. The SOG and the oxide 16 block the etching of the substrate below trench 20, so that an island structure 22 is formed, comprised of CVD oxide 16, SOG 18, and silicon substrate 10. During the chlorine etch, the SOG and oxide 16 are also etched, although the SOG to silicon etch selectivity is approximately 20:1 in a $Cl_2$ RIE. Thus, FIG. 1g depicts SOG 18 and oxide 16 having a lessor height as compared to FIG. 1f. As can be seen from FIG. 1g, the island structure includes a top 23 and sidewalls 24 and 26. Also, silicon substrate 10 has a new top surface 28.

Figure 1H:
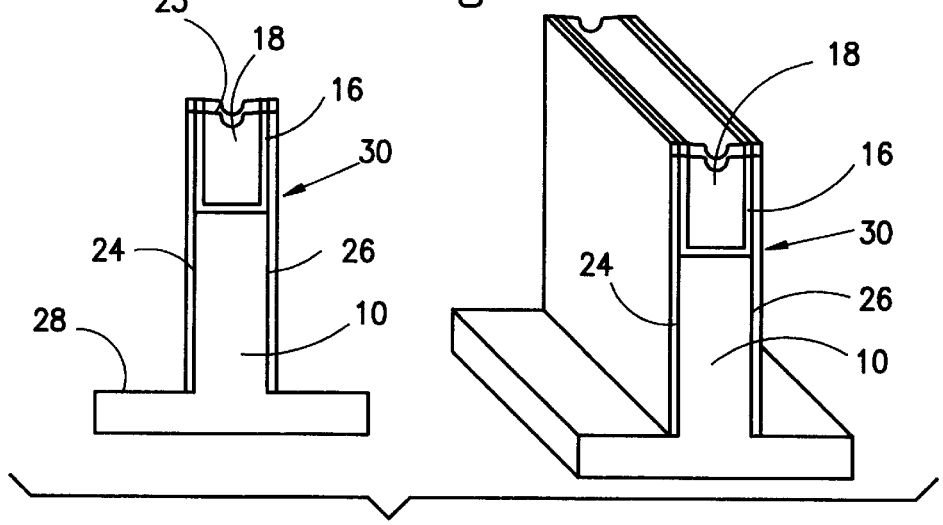
Figure 1I:
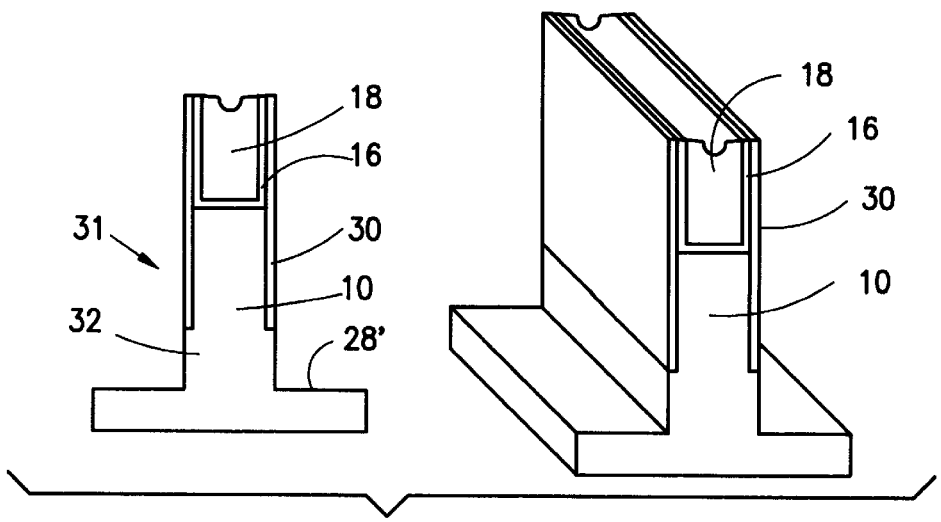
Figure 1J:
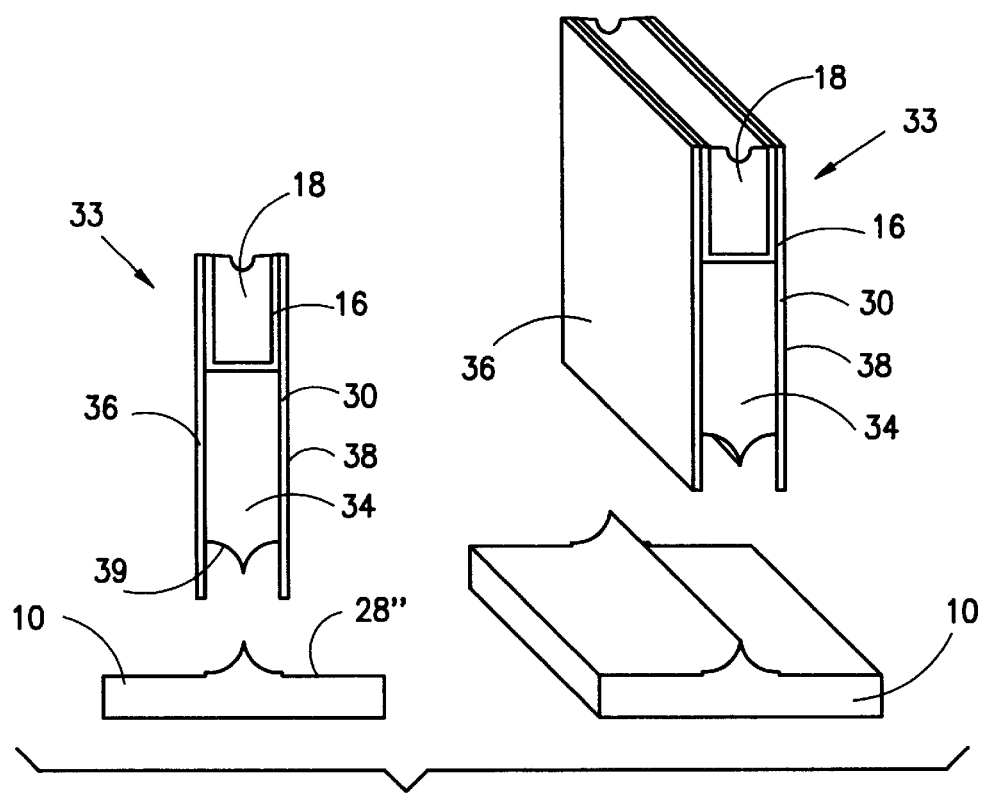

As illustrated in FIG. 1h, a conformal layer, approximately 3000 Å thick, of low temperature CVD silicon dioxide 30 is deposited on sidewalls 24, 26 and on top surface 23 and 28. Other conformally coated materials having a high etch selectivity over the substrate material may be used such as, for example, silicon nitride. An anisotropic etch of silicon dioxide is conducted using $CHF_3$ or $CF_4$ RIE to remove the oxide from the top surface 28 of silicon substrate 10 and from the top surface 23 of island structure 22, leaving behind a protective oxide layer 30 covering the sidewalls 24, 26.

A chlorine RIE step is then used to etch further down into the silicon substrate 10 to a depth of between 2 to 5 μm, leaving an extended island structure 31, as depicted in FIG. 1a. The top surface of the substrate is lowered, as at 28', below the side wall oxide 30, exposing the silicon forming the base 32 of the island structure.

Next, referring to FIG.. 1j, structure 31 is released from substrate 10 by an isotropic $SF_6$ RIE etch which removes base silicon 32 to produce a released beam 33 which is comprised of oxide 16, SOG 18 and a core 34 of silicon. The beam further includes sidewalls 36, 38 formed from the silicon dioxide sidewall layer 30. As illustrated, the release etch extends upwardly behind the dioxide walls 36, 38 to produce an overhang below the bottom 39 of the beam, and also further lowers the surface of substrate 10, as indicated at 28".

Figure 1K:
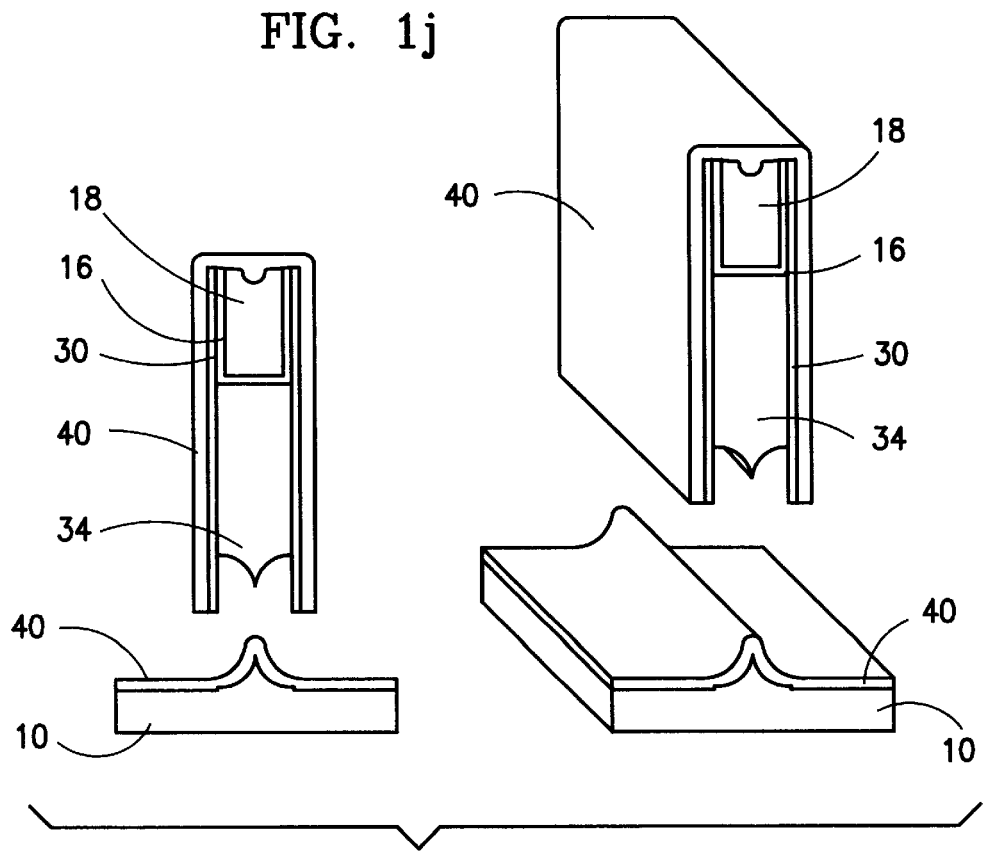

As a final step, FIG. 1k depicts a metal layer 40, preferably aluminum, which is sputtered over beam structure 33 to cover the top and the side walls of the beam, and to cover the surface 28" of the substrate 10. The metal layer is typically formed 1000 to 4000 Å thick.

FIGS. 2a to 2m depict, in cross-section, the steps for forming SOG trench filling mask structures of different heights in a single substrate. Although any number of SOG masks of differing heights can be formed, FIGS. 2a–m specifically illustrate process steps for forming three different mask heights, through the formation of three different trench depths. Conventionally, in order to fabricate structures of different height, one structure at a time must be formed. Unfortunately, lithography becomes difficult after defining the first structure since lithography has to be done on the surface of structures or formations having large topology. This problem becomes more severe as the height of the structures increases. With the present fabrication technique, a first trench is etched and filled, and then the surface is planarized in preparation for the next lithography step. Thus, the present process makes it possible to fabricate tall microstructures of different heights with very small gaps between the structures.

Referring to FIG. 2a, the process starts with a bare silicon wafer 50 serving as a substrate and having a surface 51. A layer 52 of oxide such as silicon dioxide is deposited over the silicon substrate surface 51. As was described above with respect to FIG. 1, the oxide can be deposited by chemical vapor deposition (CVD) or evaporation or can be thermally grown. A first level lithography is conducted to expose the oxide at the location (or locations) 54 of what will ultimately be the deepest trenches. The oxide is then patterned by dry etching, using for example $CHF_3$ or $CF_4$ RIE, at the locations of the deepest trenches.

As depicted in FIG. 2b, an etch step with a high etch selectivity of silicon to oxide is carried out to etch a trench 56 into the silicon substrate 50. A suitable etchant is $Cl_2$ RIE.

A photoresist layer 58 is next deposited and another lithography is performed to expose the silicon oxide layer 52 at the location (or locations) of what will ultimately be shallower trenches 60, as illustrated in FIG. 2c. The oxide 52 at the locations of the shallower trench as 60 is etched away by anisotropic dry etching ($CHF_3$ or $CF_4$ RIE) (see FIG. 2d), and all photoresist is subsequently removed, resulting in the cross-section depicted in FIG. 2e.

Referring to FIG. 2f, an etch step with a high etch selectivity of silicon to oxide (e.g. $Cl_2$ RIE) is again done to etch into the silicon substrate 50, making trench 56 deeper and forming shallower trench 62.

As depicted in FIG. 2g, a third lithography step is done to define the locations of what will ultimately be the shallowest trenches. A photoresist layer 64 is deposited on oxide layer 52 and patterned to expose the oxide at the location (or locations) of the shallowest trench as 66. The oxide 52 is then etched away at the locations of the shallowest trenches 66, the etch being conducted using a dry anisotropic etch as previously explained.

Figure 2H:
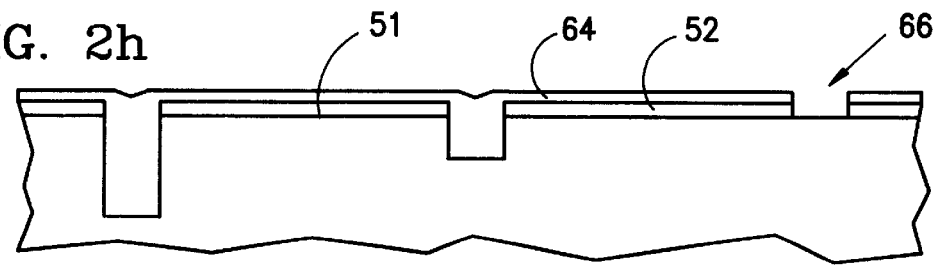
Figure 2I:
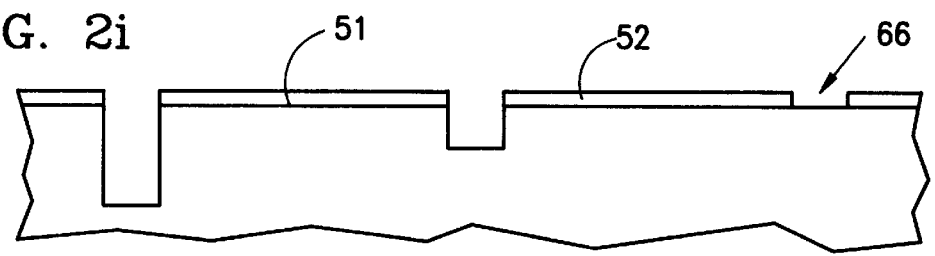
Figure 2J:
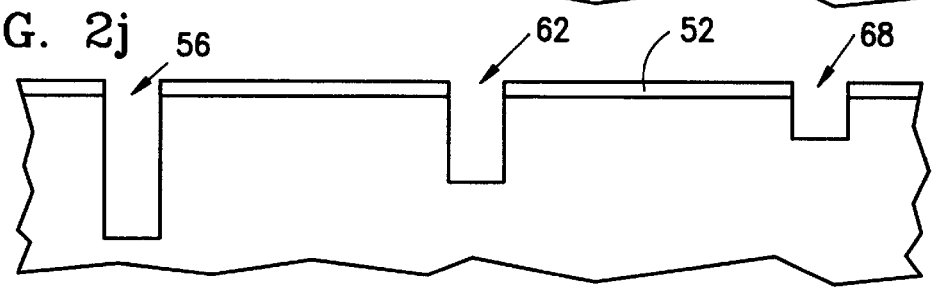

All the photoresist 64 is removed, FIG. 2i, and an etch step with a high selectivity of silicon to oxide (e.g. $Cl_2$ RIE) is done to etch further into the silicon wafer substrate. Now the shallowest trench 68 is formed, with each of the trenches 56 and 62 becoming deeper.

Figure 2K:
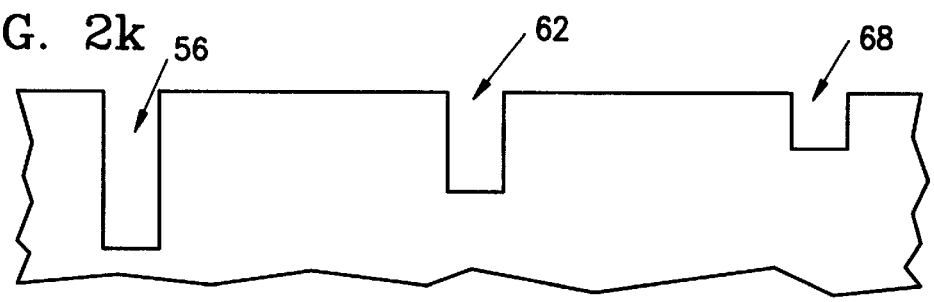

As depicted in FIG. 2k, all oxide 52 is removed to expose substrate surface 51, by dipping the wafer into buffered hydrofluoric acid. Other dry etching processes can be used, for example, $CHF_3$ RIE. This step is optional but may be helpful in some applications. Thus, what remains are three trenches of different depths.

Figure 2L:
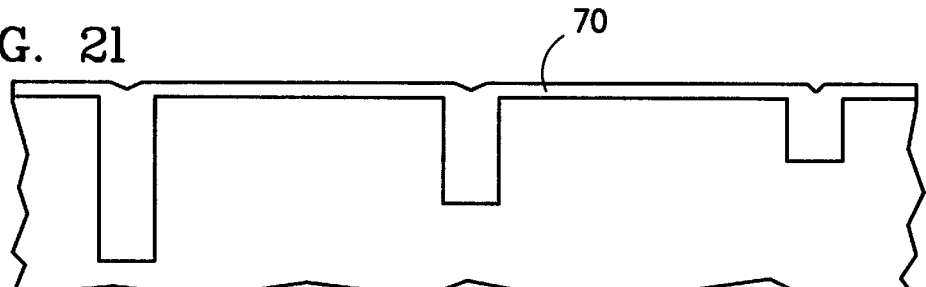
Figure 2M:
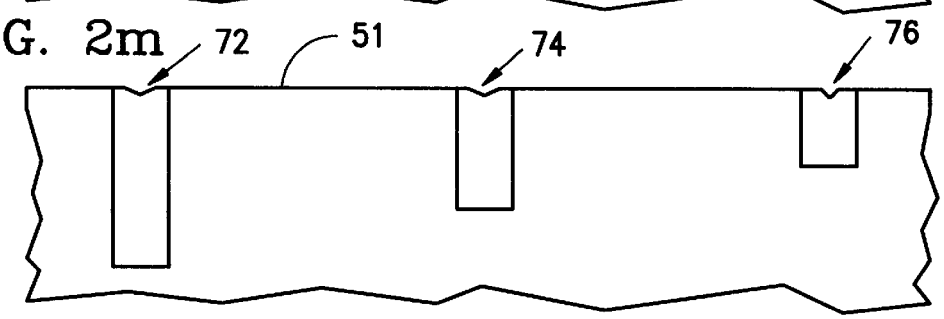

Referring to FIG. 2l, SOG layer 70 is spun on and subsequently baked and cured as was described with respect to FIG. 1e. Again, other filling mechanisms, such as BPSG or PSG, may be appropriate, depending upon a particular application. The SOG on the top silicon surface 51 is then removed by an etch-back using, for example, $CF_4$ RIE (see FIG. 2m). Mechanical polishing may also be used to expose the bare silicon surface 51 except at the locations of the filled trenches 72, 74 and 76.

FIGS. 3a–h depict, in cross-section, process steps for forming SOG trench filling mask structures at a level below the top surface of a substrate. The process steps are generally similar to those described previously with respect to FIGS. 1 and 2. The resulting filled trenches 72, 74 and 76 serve as masks during subsequent etch steps to be described later. These filled trenches become either tall, released beam structures in their own right, or serve as masks during additional deep etching into the base silicon substrate to form high aspect ratio beams. Again, these processes will be described later.

Figure 3A:
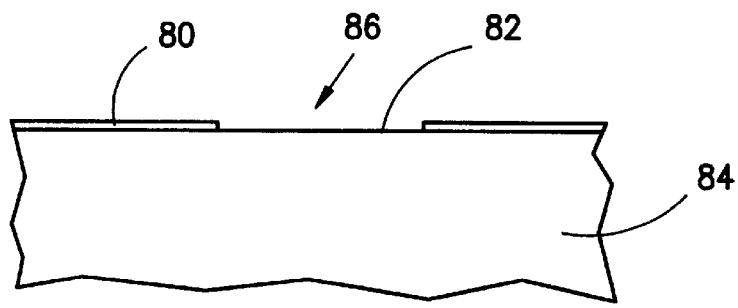
FIGS. 3a–3h illustrate in diagrammatic form the process steps associated with forming multi-level mask structures.

Referring to FIG. 3a, a conformal layer of silicon dioxide is deposited on the top surface 82 of silicon substrate 84. As previously described, the oxide layer can be deposited by evaporation or CVD, or thermally grown. The silicon oxide is then patterned by lithography and $CHF_3$ or $CF_4$ RIE such that the silicon substrate 84 is exposed at the area 86 where a lower level structure will be formed. A large open area 86 is required to form a wide well. This ensures that SOG will fill the trench that will be ultimately formed at the bottom of the well defined by the open area, rather than fill the well.

Figure 3B:
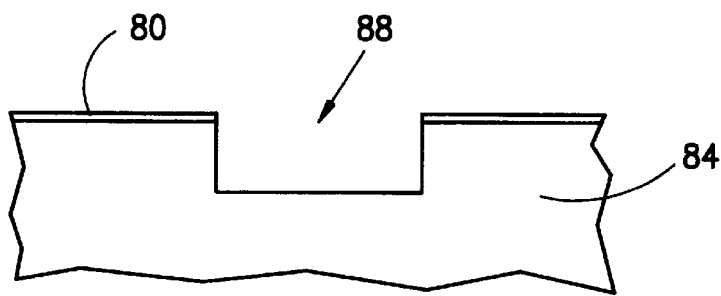
Figure 3C:
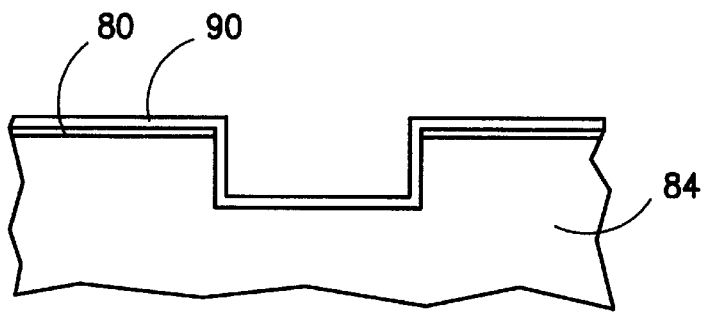
Figure 3D:
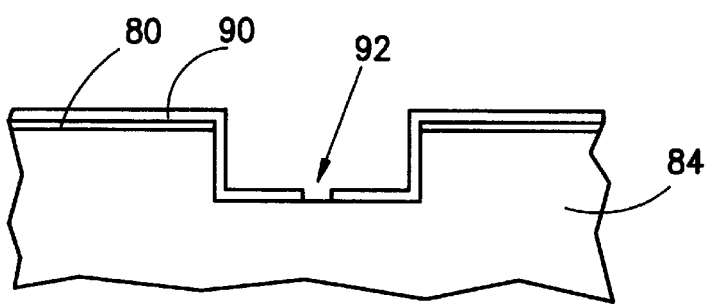

As depicted in FIG. 3b, an etch step with high silicon to silicon dioxide etch selectivity is done to etch into the substrate 84 to a desired depth, forming a large trench 88. A layer 90 of silicon dioxide is then deposited (by CVD or evaporation) or is thermally grown, resulting in the cross-section as depicted in FIG. 3c. The silicon dioxide 90 is then patterned by lithography and $CHF_3$ or $CF_4$ RIE to define areas 92 where trenches will be etched (FIG. 3d).

Figure 3E:
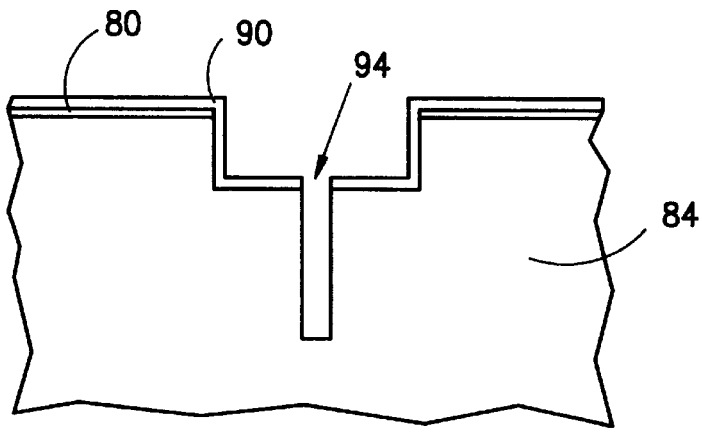
Figure 3F:
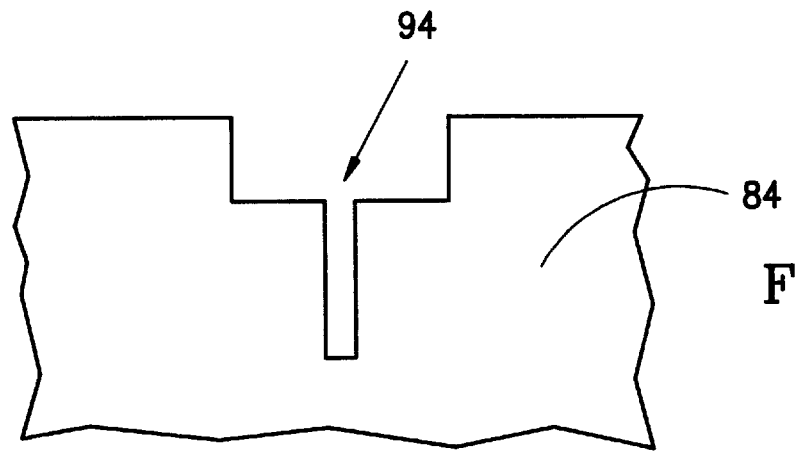
Figure 3G:
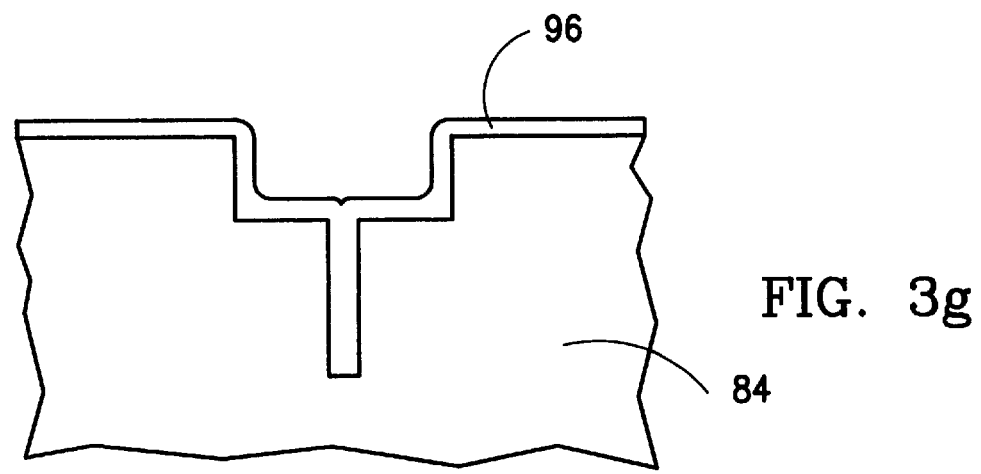

An anisotropic etch (e.g. $Cl_2$ RIE) is conducted to etch deep into the substrate 84, forming trench 94, as illustrated in FIG. 3e, and the oxide layers are etched away (FIG. 3f). Thereafter, a SOG layer 96 is spun on (FIG. 3g) and subsequently baked and cured as was described with respect to the previous FIGS. 1e and 2l. Again, other filling mechanisms, such as BPSG or PSG, may be appropriate, depending upon a particular application.

Figure 3H:
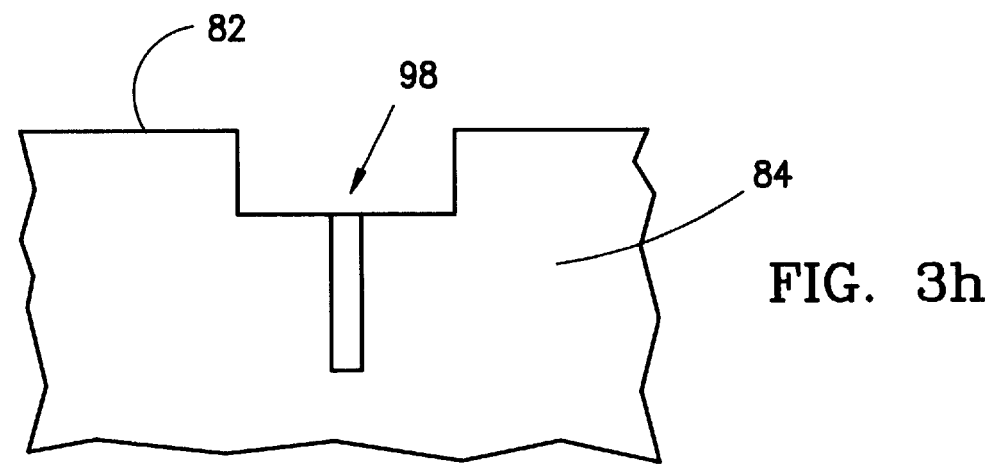
Figure 4:
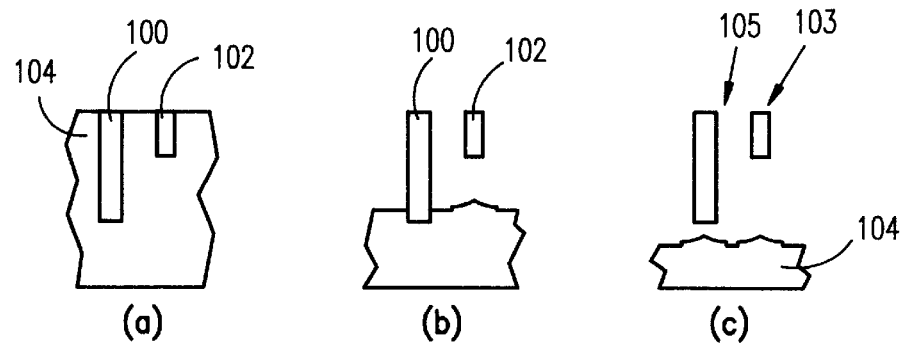
FIGS. 4a–4c illustrate in diagrammatic form the process steps associated with forming differently sized released structures.
Figure 5:
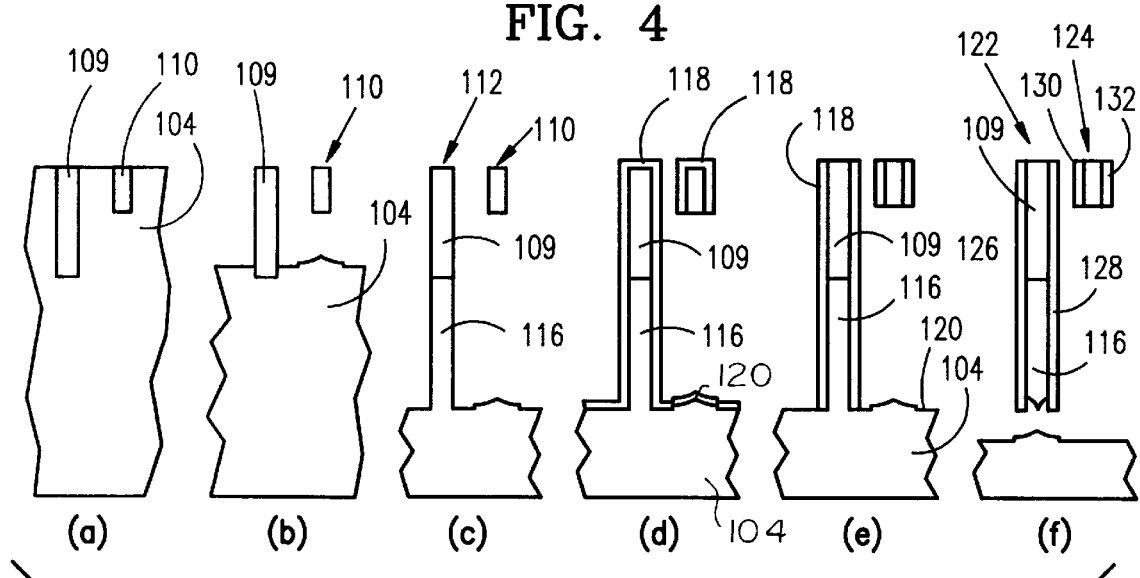
FIGS. 5a–5f illustrate in diagrammatic form the process steps used to form differently sized released structures having oxide sidewalls.

As illustrated in FIG. 3h, the SOG on the top of silicon substrate 84 is then removed by an etch-back using, for example, $CF_4$ RIE, resulting in SOG-filled trench 98. Mechanical polishing may also be used to expose the bare silicon surface 82 except at the location of the filled trench. As was described with respect to FIG. 2, SOG filled trench 98 can serve either as a released beam or as a mask during deep silicon etching to form high aspect ratio beams.

FIGS. 2 and 3 illustrate the various ways in which SOG trench fill masks can be formed. FIGS. 4–9 depict, in cross-section, various ways in which, depending on the specific application, the mask structures can be used to form release structures. These Figures depict "post-fill-up" processes.

Referring to FIG. 4a, SOG masks 100 and 102 of different depths are shown in a substrate 104 after the trench filling process steps as discussed above with respect to FIGS. 2a–2m. At this point, an etch step is conducted, using an isotropic etch such as $SF_6$ RIE to first release the SOG structure 102 (FIG. 4b) and to thereafter release SOG structure 100 (FIG. 4c). The released SOG structures preferably are cantilevered, from unetched substrate adjacent the ends of the SOG beams. During etching, SOG also is etched although the selectivity of silicon/SOG is about the same as that of silicon/regular silicon dioxide, which is typically approximately 20:1 in $Cl_2$ RIE.

FIGS. 5a–5f generally depict the release of much taller (higher aspect ratio) structures. Using the trench filling process steps as described with respect to FIGS. 2a–2m, SOG structures 109 and 110 are formed as depicted in FIG. 5a. An isotropic etch (e.g. $SF_6$ RIE) is then used to release the "shorter" structure 110 as seen in FIG. 5b. Referring to FIG. 5c, an anisotropic etch (e.g. Chlorine RIE) is then used to etch further down into substrate 104, resulting in a island 112 comprised of SOG mask 109 on top of substrate core region 116. As illustrated in FIG. 5d, a layer 118 of oxide is conformally deposited through, for example CVD or evaporation, or thermally grown on the structures 110 and 112, as well as covering the top surface 120 of substrate 104. An anisotropic etch step is then used to etch away the oxide on the top of island 112 and on substrate surface 120, thus exposing the substrate 104, FIG. 5e. Finally, an optional anisotropic etch using, for example, $Cl_2$ RIE, followed by an isotropic etch using, for example $SF_6$ RIE, is done to etch under sidewall layer 118 and through core 116 at the base of island 112 to release the island and to produce a "taller" beam structure 122 and "shorter" beam structure 124. Taller structure 122 consists of SOG region 109 and silicon core region 116 bounded by oxide walls 126 and 128 formed from layer 118. Similarly, shorter structure 124 consists of SOG region 110 bounded by oxide walls 130 and 132, also formed from oxide layer 118.

Figure 6:
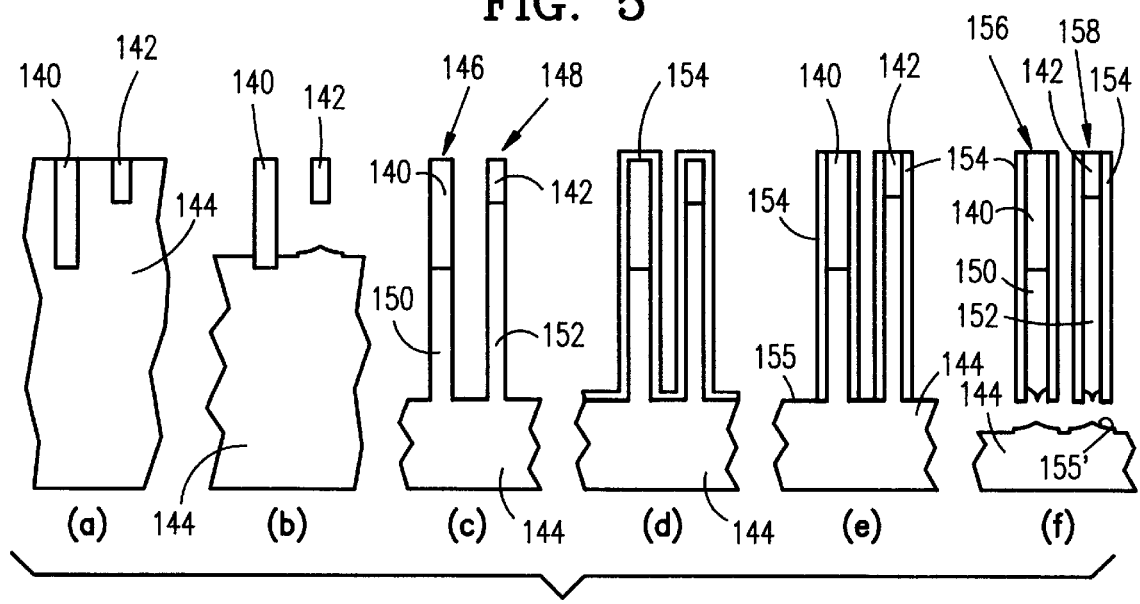
FIGS. 6a–6f illustrate in diagrammatic form the process steps used to form similarly sized released structures having oxide sidewalls.
Figure 9:
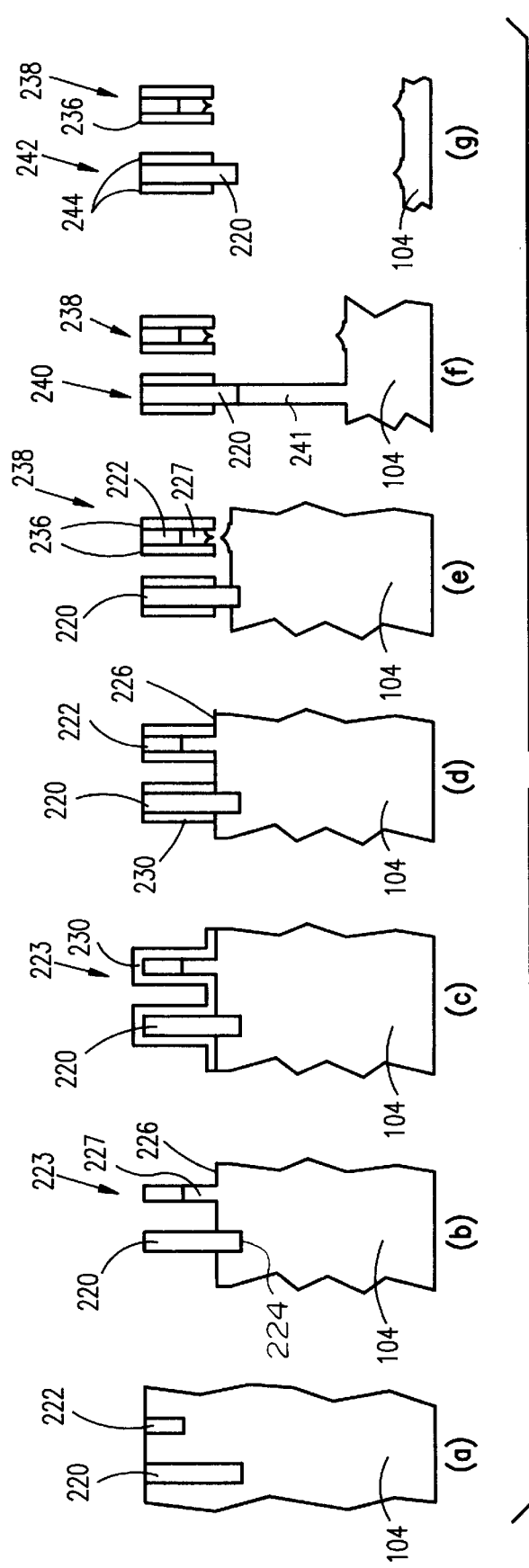
FIGS. 9a–9g illustrate in diagrammatic form the process steps used to form structures having differently sized interiors, but with similarly sized sidewall oxide layers.

FIG. 6 depicts process steps for forming two similar "tall," or high aspect ratio structures, each formed from a SOG mask having a different height than the other. After fill-up in accordance with FIGS. 2a–2m, SOG masks 140 and 142 are provided in silicon substrate 144 (FIG. 6a). Referring to FIG. 6b and FIG. 6c, an anisotropic etch step is conducted to etch down into the substrate to form island structures 146 and 148. Each island consists of a SOG region, 140 and 142 respectively, over a region of silicon, 150 and 152 respectively. As depicted in FIG. 6d, a conformal layer of oxide 154 is deposited or thermally grown on both islands, and an anisotropic etch (e.g. $CF_4$ RIE) is conducted to etch away the oxide on the tops of the islands and on surface 155 of the substrate, exposing the silicon substrate 144 at surface 155. An optional anisotropic etch using, for example, chlorine RIE, followed by an isotropic etch using, for example, $SF_6$ RIE, are then conducted, forming released beam structures 156 and 158 extending over the floor 155' of substrate 144.

FIGS. 7a–7h depict process steps for producing a released solid structure and a released structure consisting only of sidewalls. FIGS. 7a–7f are essentially the same as those shown in FIGS. 6a–6f, and as such they will not be described. These steps result in the released beam structures 160 and 162 depicted in FIG. 7f. Each of these structures includes a SOG region, 164 and 166 respectively; a silicon core region, 168 and 170 respectively; and sidewalls 172 and 174, respectively. An anisotropic oxide etch (e.g., $CF_4$ RIE) is then conducted on the structure of FIG. 7f to etch away the tops of structures 160 and 162, specifically, to remove all the SOG oxide 166 of structure 162 and a part of the SOG oxide 164, as illustrated in FIG. 7g. Another etch with high etch selectivity of substrate to oxide (either an isotropic or an anisotropic etch may be appropriate) is then used to etch all the remaining silicon in beam structure 162, leaving only thin sidewalls 174, as seen in FIG. 7h. These side walls provide ultra-high aspect ratio "flexure" beam structures, which can be easily fabricated without going through the complex lithography previously required when attempting to form structures having large aspect ratio variations. Thus, through the use of a trench filling SOG mask, both very thin structures and thick, solid structures can be formed on the same substrate during a single process.

FIGS. 8a–8i illustrate a process for fabrication of SOG released beams having multiple side wall layers and being of different aspect ratios. After fill-up, (FIG. 8a) an anisotropic etch is conducted around SOG masks 180 and 182 to etch down into the substrate 104, leaving the bottom of SOG mask 180 below the surface 184 of substrate 104 (FIG. 8b) and forming island structure 183. As depicted in FIGS. 8c and 8d, a conformal layer 186 of oxide is then deposited or thermally grown on the substrate, on mask 180, and on island 183. This is followed by an anisotropic etch that removes the oxide 186 from the surface 184 and from the tops of masks 180 and 182. Referring to FIG. 8e, an isotropic etch (e.g. $SF_6$ RIE) is then used to release island 183 and to form beam structure 190 having oxide sidewalls 192 formed from layer 186 and bounding SOG region 182 and silicon core region 194 below the SOG region 182. SOG mask 180 is not released at this stage, but instead forms an island having sidewalls 198 bounding only the SOG region 180. An anisotropic etch (e.g., Chlorine RIE) is then conducted to etch deep into the substrate 104, resulting in an unreleased island structure 200 depicted in FIG. 8f. Island structure 200 consists of SOG region 180, including sidewalls 198, atop a core silicon region 202.

As depicted in FIG. 8g, the island 200 and beam 190 structures are then coated by a conformal layer of oxide 204. Thereafter, the oxide 204 is etched away from the surface 206 of substrate 104 and from the tops of structures 190 and 200 by an anisotropic oxide etch (e.g., $CF_4$ RIE), as illustrated in FIG. 8h. Finally, referring to FIG. 8i, the island structure 200 is released from the substrate 104 by an isotropic etch with a high etch selectivity of substrate to oxide (e.g., $SF_6$ RIE) to provide a released beam.

Another configuration for released beams fabricated utilizing the above-described SOG masking process is illustrated in FIGS. 9a–9g, wherein beams having differently sized interior, or core, structures but similar oxide sidewalls are provided. Referring to FIGS. 9a and 9b, after fill-up an anisotropic etch step is conducted to etch down into the substrate around SOG masks 220 and 222, as has been described previously, to produce island 223. As was done with the structures of FIG. 8, etch depth is controlled such that the bottom 224 of the SOG trench-filling mask 220 remains below the top surface 226 of substrate 104. Island 223 includes SOG mask 222 and underlying silicon region 227, as previously described with respect to FIGS. 7b and 8b. As depicted in FIG. 9c, a conformal layer of oxide 230 is then deposited or thermally grown over the entire structure, and an anisotropic etch (e.g., $Cl_2$ RIE) is then conducted to remove the oxide 230 from the surface 226 of substrate 104 and from the tops of SOG mask 220 and island 223 (see FIG. 9d). Referring to FIG. 9e, an isotropic etch (e.g. SF$_6$ RIE) is then used to release island structure 223 beneath sidewalls 236 formed from layer 230 and bounding SOG region 222 and underlying silicon region 227 to produce released beam 238. An anisotropic etch (e.g., Chlorine RIE) is then conducted to etch deep into the substrate 104, resulting in the island structure 240 depicted in FIG. 9f and including SOG mask 220 and underlying core structure 241. Finally, an isotropic etch (e.g., SF$_6$ RIE) is conducted to release the island structure 240, to produce released beam 242 having oxide sidewalls 244 formed from layer 230. Since sidewalls 236 and 244 were formed by layer 230 when the underlying mask 220 and island 222 were at the same height (FIG. 9d), the sidewalls also are of the same height, even though the underlying SOG mask 220 in beam 242 is of a different height than the underlying SOG mask 222 and core 227 in beam 238.

It should be noted that a layer of metal such as aluminum can be sputtered onto the structures depicted in FIGS. 4c, 5f, 6f, 7h, 8i and 9g. This metal covers the sidewalls of the structures nearly conformally, typically to a thickness of approximately 0.2 μm, and was illustrated with respect to the description of FIG. 1.

It also important to note, that with respect to FIGS. 4–9 the SOG mask itself can be removed, leaving a silicon beam structure. SOG can be removed by using either a dry etching step using, for example, CHF$_3$ or CF$_4$ RIE. This etching also etches silicon. Or, a buffered hydrofluoric acid (BHF) can be used to remove the SOG without attacking the silicon beams. It is worth noting that SOG becomes very similar to pure silicon oxide in terms of processing, after curing. Typical applications require electrical isolation between silicon and an aluminum metallization layer, thus in carrying out the present process, it is useful to leave SOG on top of silicon beams to separate the silicon from the metallization.

Figure 10:
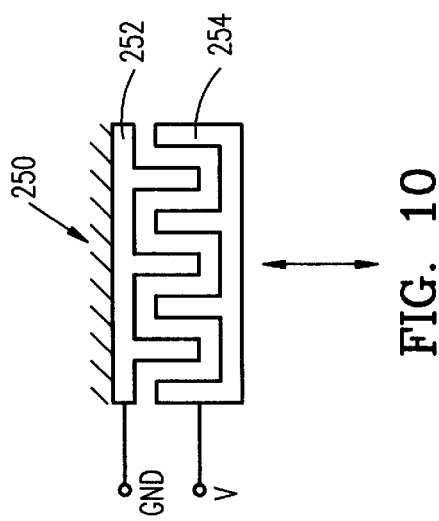
FIGS. 10 and 11a–11g illustrate in diagrammatic form a portion of a linear XYZ microactuator fabricated using the process steps described above.

FIGS. 10 and 11 illustrate an application of the present invention in the forming of a linear ultra-high aspect ratio comb-type micro-actuator. FIG. 10 is a top plan view of the basic structure of an electrostatic comb actuator 250, depicting a movable fingers element 252 and a fixed fingers element 254. The fingers are conductive, or are covered by conductive layers, so that when appropriate potential differences are applied between the fixed and movable fingers, relative movement is produced.

Figs. 11a–11g depict a 3-D, cutaway view of a comb actuator formed using the present inventive process. The process steps used to form the actuator include steps described with respect to FIGS. 1, 2 and 3.

Figure 11A:
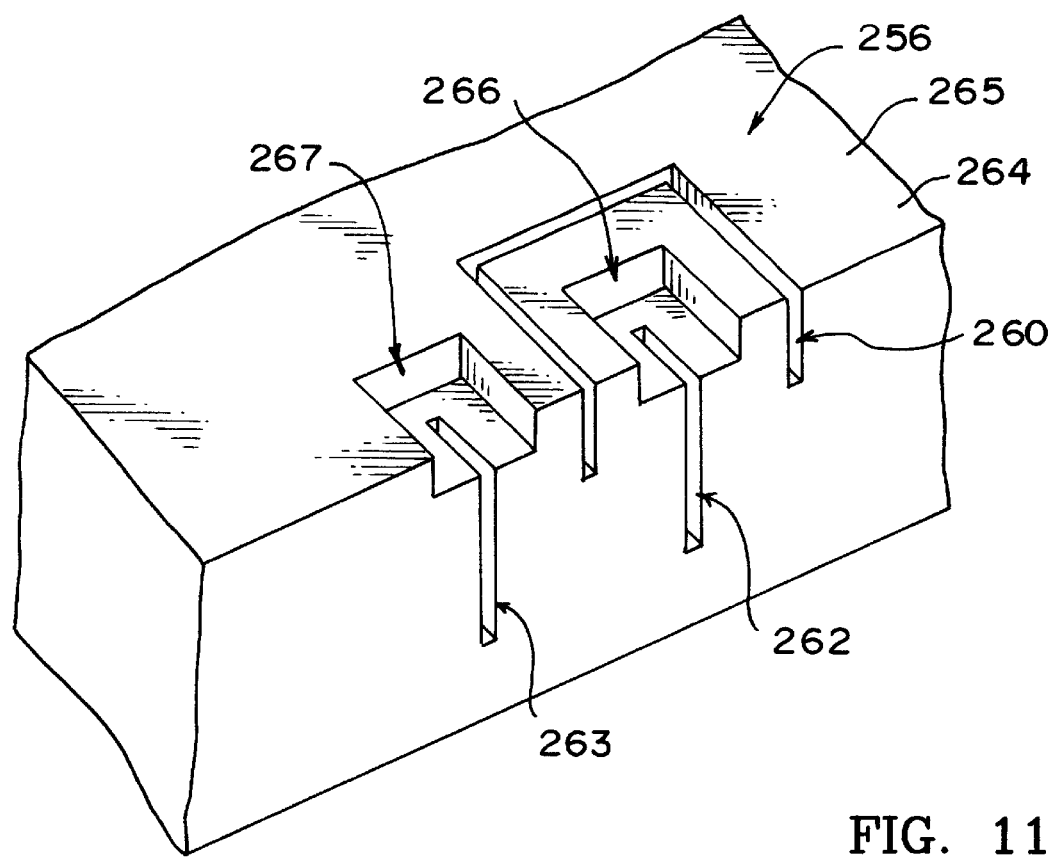

Fig. 11a illustrates at 256 a "masking trench" design for the actuator of FIG. 10, in a cutaway view, depicting shallow trench 260, and deeper trenches 262, 263 formed in a silicon substrate 264 having a top surface 265. These trenches are formed at different depths in the manner as described previously with reference to FIGS. 2 and 3. For example, trenches 262 and 263 are formed at the bottom of wells 266 and 267 as described with respect to FIG. 3. The trenches can be formed closely spaced together, for example 3 to 6 μm apart. In addition, the trenches can be formed to a variety of depths, for example 5 μm deep for shallow trench 260, and approximately 10 μm for deeper trenches 262 and 263, measured from the bottom of 1–3 μm deep wells 266 and 267.

Figure 11B:
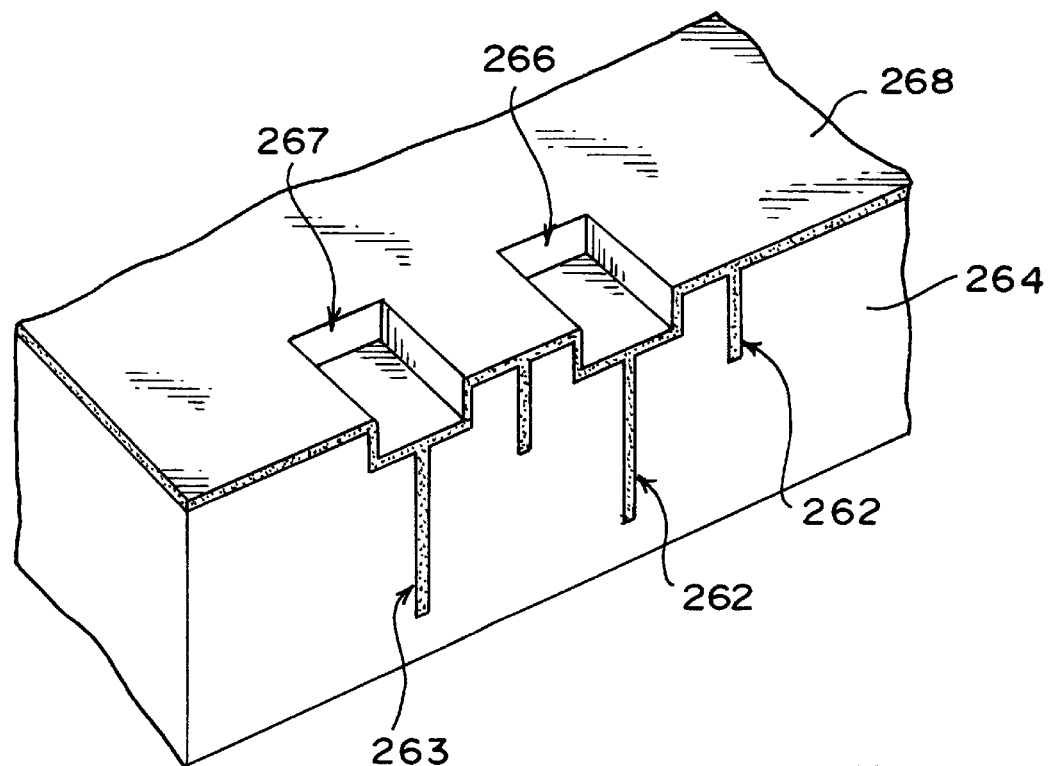

FIG. 11b depicts the deposition of SOG layer 268 to a depth of 4 μm on the top surface of substrate 264. The SOG fills each of the trenches 260, 262 and 263, but does not fill wells 266 and 267 during the spin-on process.

Figure 11C:
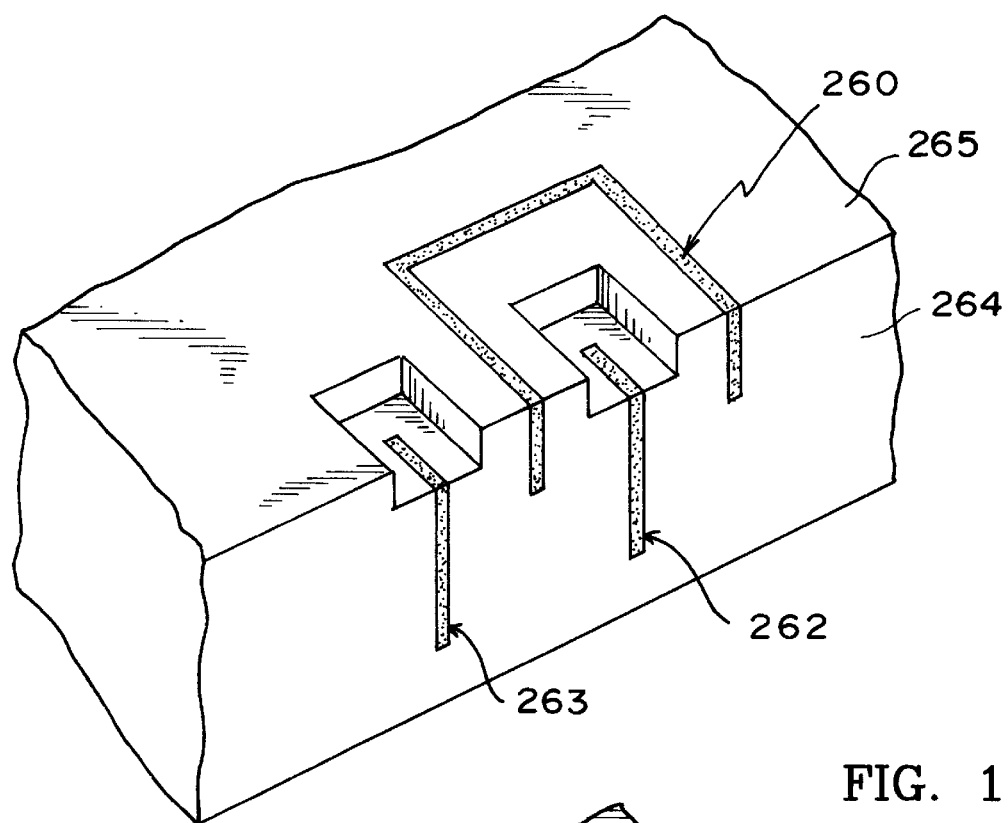

As depicted in FIG. 11c the SOG layer is etched from the top surface of substrate 264, leaving trenches 260, 262 and 263 filled with SOG.

Figure 11D:
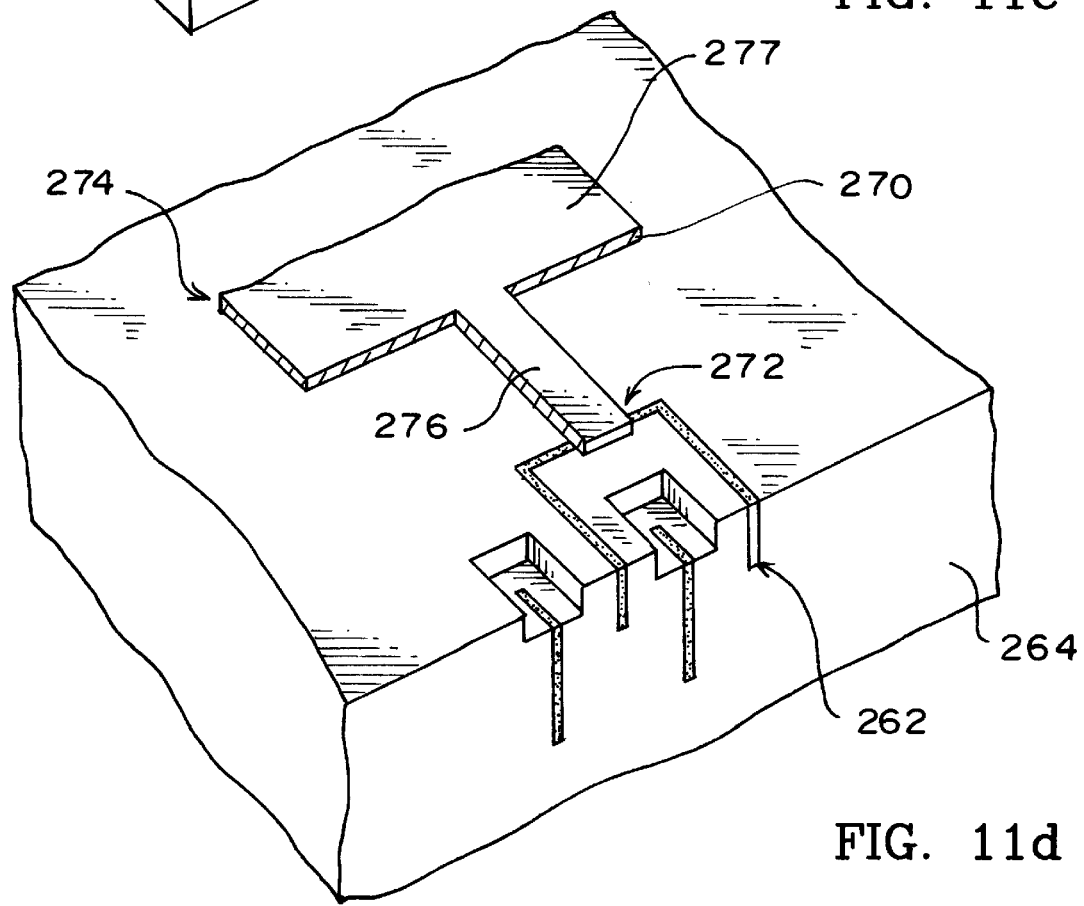

With reference to FIG. 11d, A layer of CVD silicon dioxide 270 approximately 1.5–2 μm thick is then deposited and patterned on the top surface 265 of silicon substrate 264. In addition, the oxide layer contacts shallow trench 262 at 272. Ultimately, the oxide layer will be formed into a spring/anchor structure 274 having a released spring portion 276 approximately 5–10 μm wide and 100–1000 μm long, and an anchor portion 277.

Figure 11E:
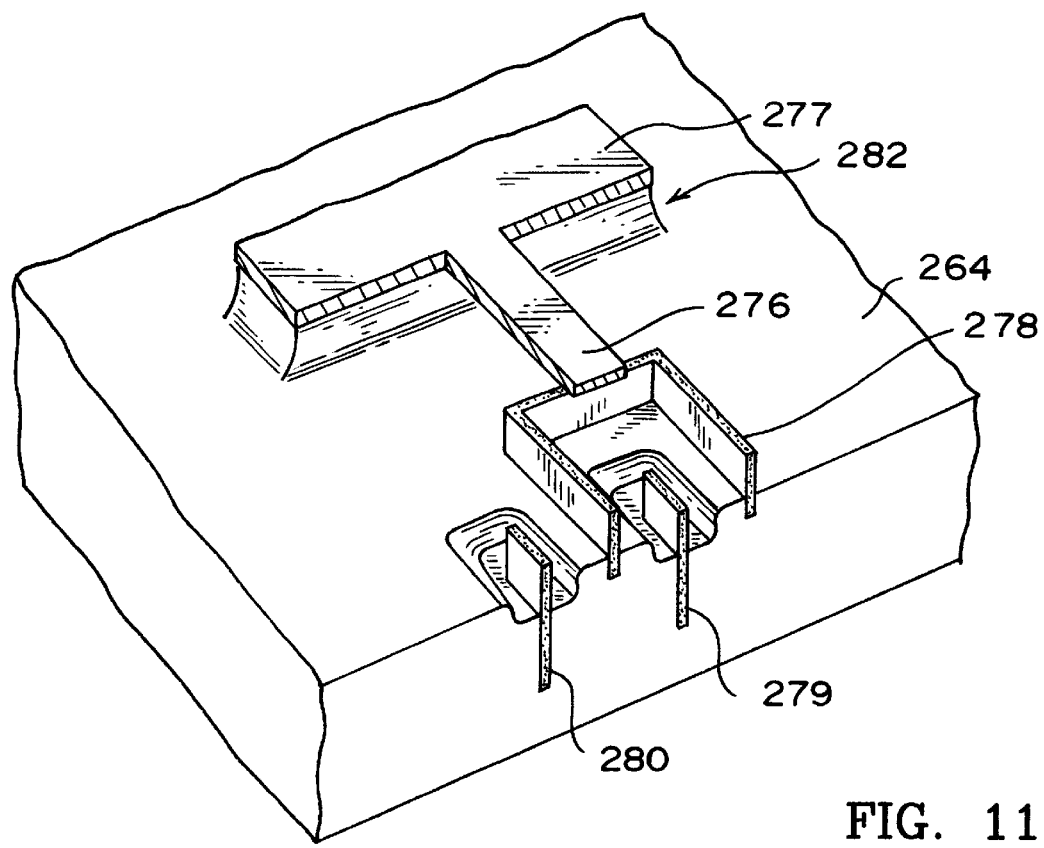

FIG. 11e depicts the partially exposed beams 278, 279 and 280, and released spring 276 resulting from an isotropic RIE into the silicon substrate 264. The isotropic etch, using SF$_6$ for example, is used to etch approximately 3–6 μm into the substrate, exposing the beams and releasing the spring 276. Due to the size of the anchor region, it is not released as a result of the etch process, but rather, it sits upon island 282.

Figure 11F:
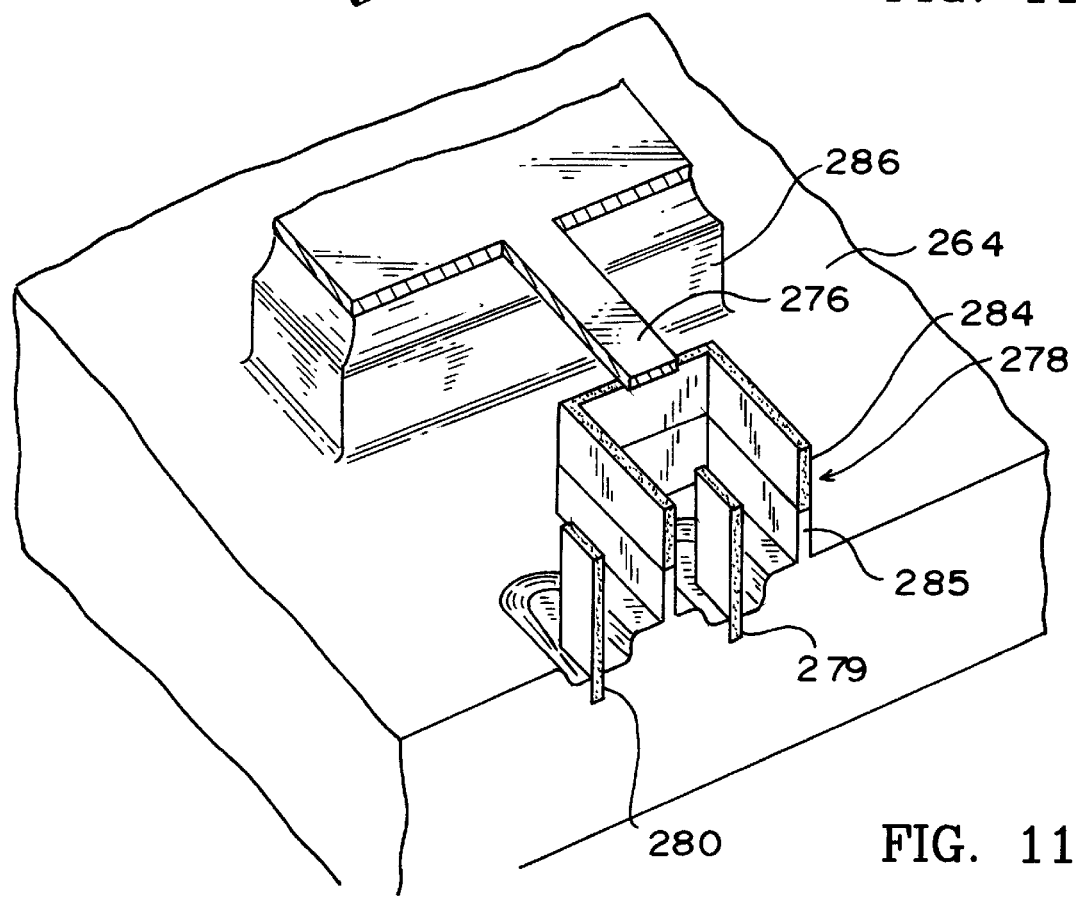

As depicted in FIG. 11f, an anisotropic RIE, using Cl$_2$ for example, is used to vertically etch approximately 5 μm further into the silicon substrate, further increasing the exposed height of beams 278, 279 and 280. As a result of the etch process, beam 278 is now formed with a top SOG region 284 and a bottom region 285, still attached to substrate 264. Beams 279 and 280, formed entirely of SOG, are also still attached to the substrate 264. Anchor 277 stands atop a taller island 286.

Figure 11G:
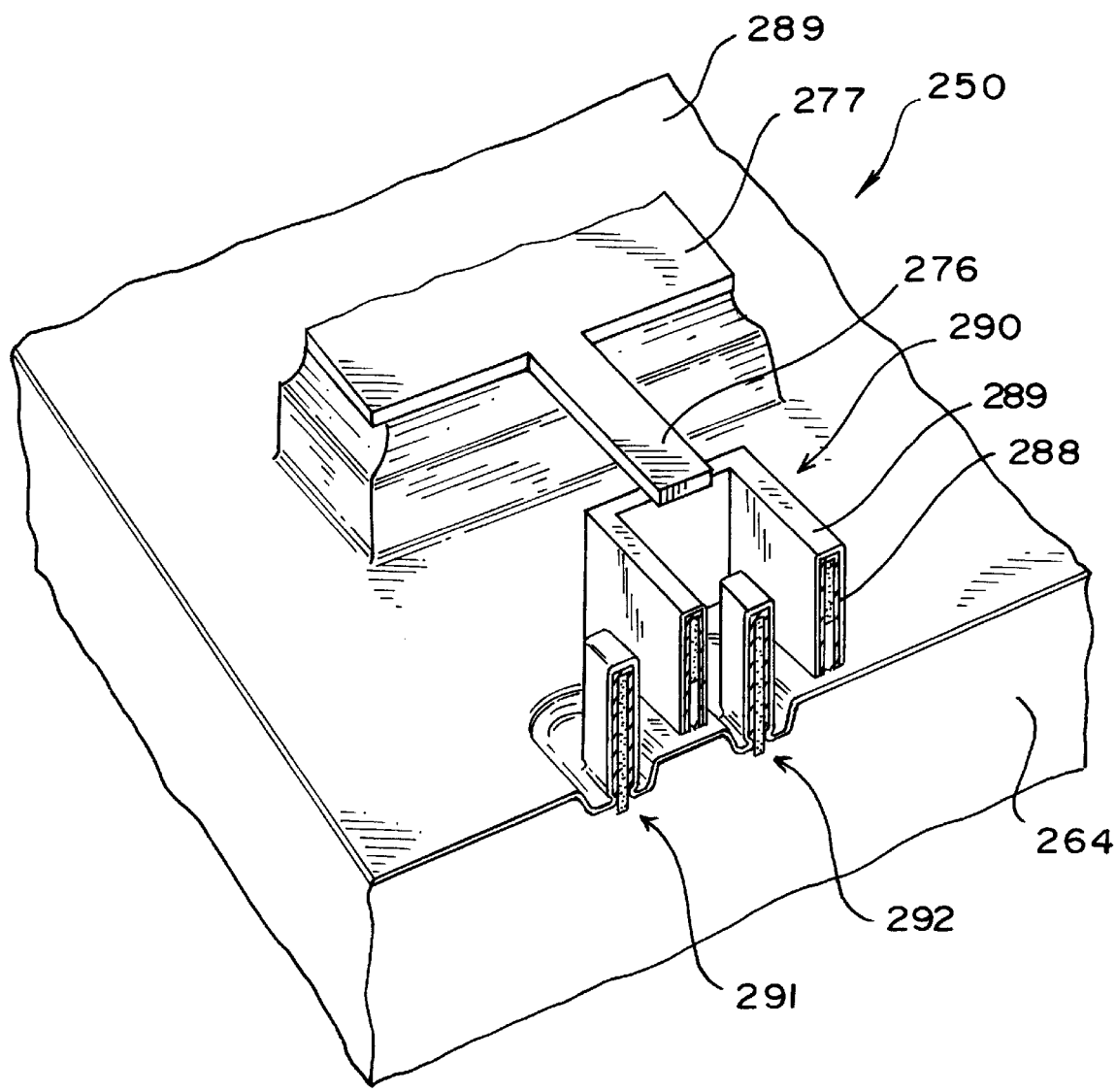

FIG. 11g depicts a final actuator structure 250. A layer of CVD oxide 288 approximately 0.2 μm thick is conformally deposited, followed by an anisotropic RIE to etch the oxide 288, exposing silicon as described with respect to FIGS. 1h and 1i. Then, an isotropic RIE etch, using for example SF$_6$, is done to release the moveable fingers 290 attached to spring 276 in the manner described with respect to FIG. 1j. It is worth noting that the fixed fingers 291 and 292 stay unreleased. Finally, a layer of metal such as, for example, Aluminum, approximately 0.2 μm thick is sputtered to form a metallization layer 289 overlaying the movable 290 and fixed fingers 291 and 292, as well as the spring 276 and anchor 277 and the base substrate 264, in a manner similar to that described with respect to FIG. 1k.

Reference is now made to FIG. 12a–12f, which depict a method for fabricating a movable waveguide structure using the SOG mask process of the invention. Such a movable waveguide would be very useful in applications such as optical alignment. A waveguide is typically composed of a core and a cladding. The present invention can be used to form a released, movable, waveguide having a core formed from SOG or some other trench filling material. The cladding includes a thin layer at the bottom of the trench, a sidewall layer and a layer on top. These layers can be deposited dielectrics or metals depending on the specific design. The use of SOG is advantageous due to the low temperatures used in the process and SOG's compatibility with various substrates. This last aspect is particularly desirable in optical waveguide structures since it is advantageous to form the optical waveguide on the same chip with a fabricated semiconductor laser.

Figure 12:
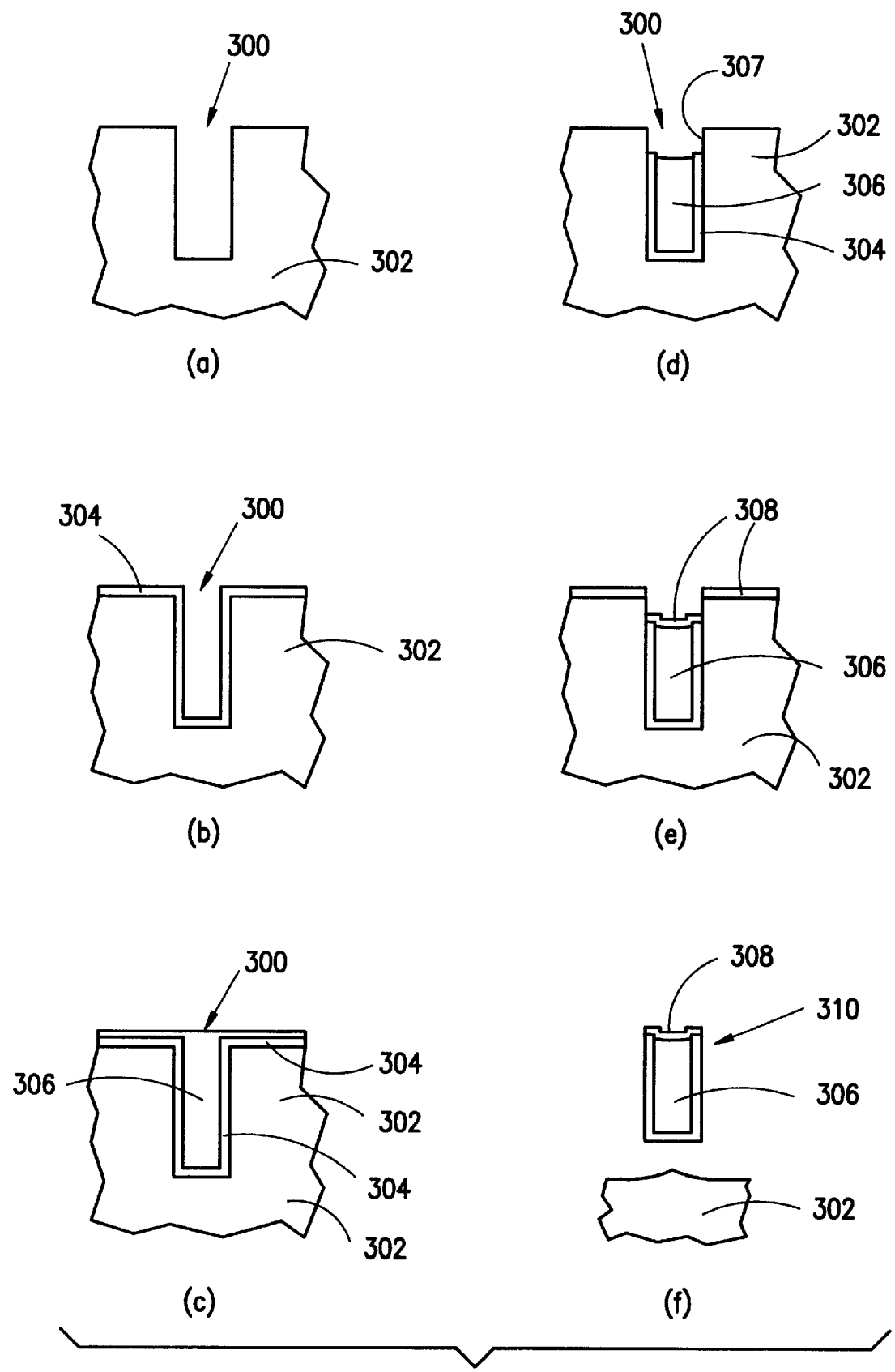
FIGS. 12a–f illustrate in diagrammatic form the process steps used in forming a movable waveguide structure.

FIG. 12a illustrates the formation of a trench 300 in a silicon substrate 302. A conformal silicon nitride layer 304 is deposited, FIG. 12b, and trench 300 is filled with SOG 306, as has been described previously, FIG. 12c. As depicted in FIG. 12d, an oxide etch back is conducted using, for example, CF$_4$ RIE, to remove oxide from the top of substrate 302 and from the top portion 307 of trench 300. Referring to FIG. 12e, a suitable waveguide material 308 is evaporated onto the structure, and finally, as depicted in FIG. 12f, the structure 310 is released by $SF_6$ RIE, resulting in a movable waveguide structure.

Figure 13A:
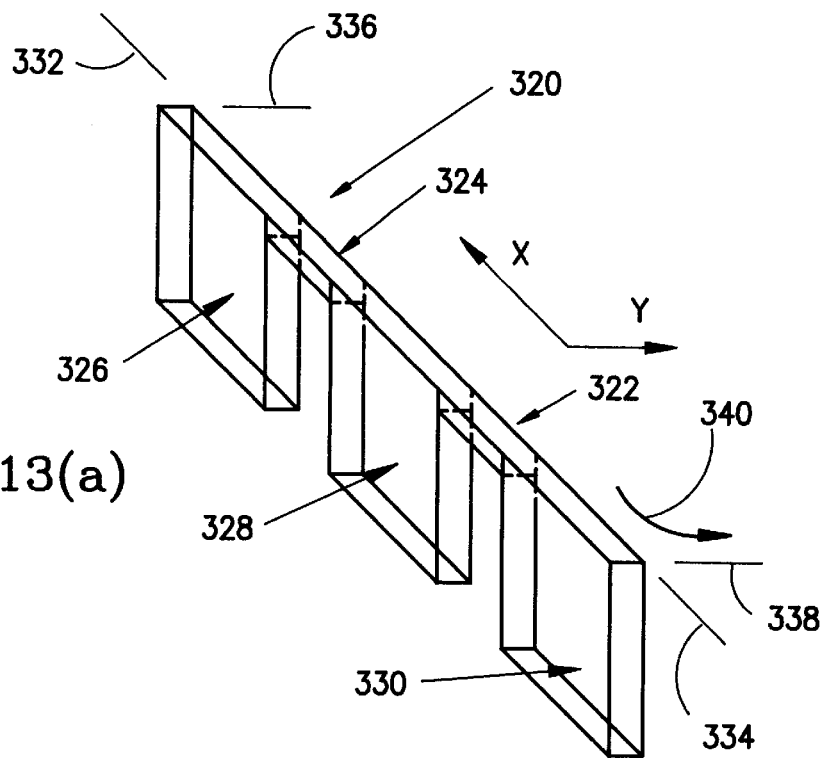
FIGS. 13a–b illustrate in diagrammatic form an in-plane movable grating structure.

FIGS. 13a and b illustrate an in-plane movable, variable (spatial) period optical grating 320, fabricated using the SOG trench filling mask process of the present invention. The XY actuators for moving the grating are not shown. FIG. 13a depicts a masking trench definition for the device, including the depiction of shallower trenches 322 and 324, as well as deeper trenches 326, 328 and 330. These trenches were formed in the manner as described with respect to FIG. 2. Lines 332 and 334 illustrate the directions for connection to X actuators for moving grating 320 along an x axis, while lines 336 and 338 indicate the directions for connection to Y actuators for moving the grating along a y axis. Directional arrow 340 indicates that the device can be connected to rotational actuators.

Figure 13B:
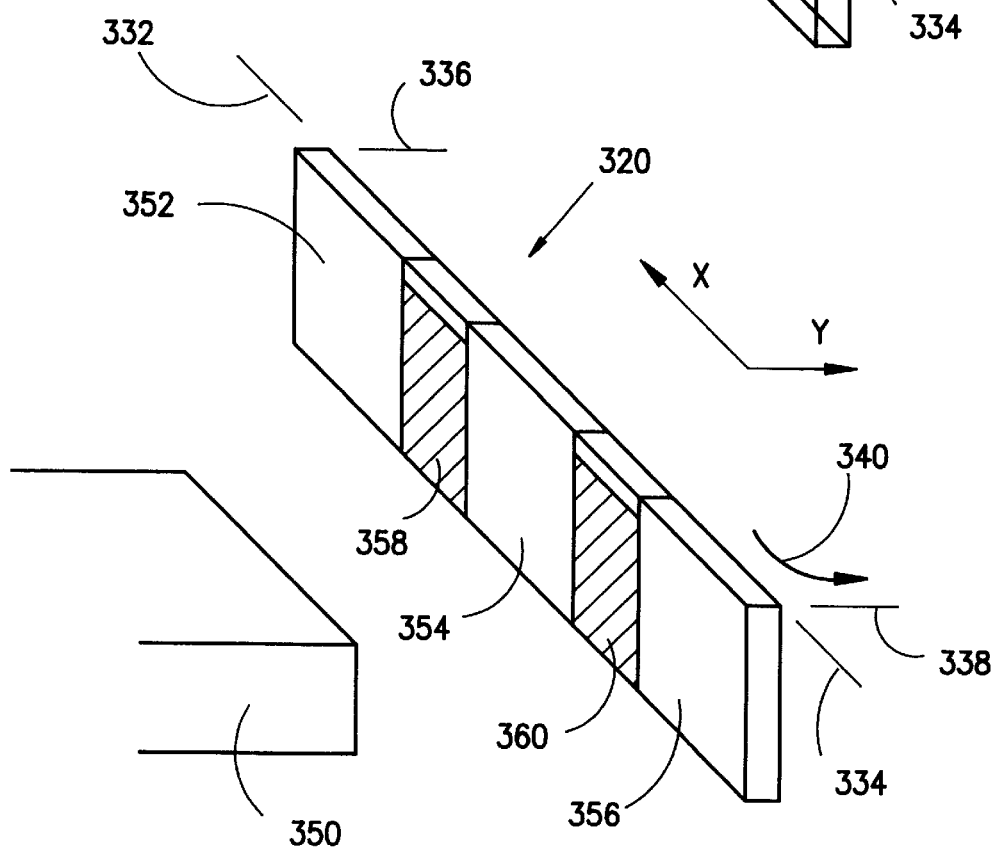

FIG. 13b illustrates the grating structure 320 after fabrication of elements in the trenches of FIG. 13a, and after their release, as described above. The grating is integrated with an on-chip semiconductor laser 350, and further includes transparent oxide regions 352, 354 and 356, as well as opaque, silicon regions 358 and 360. The oxide regions are the SOG trench-filling material in trenches 326, 328 and 330, respectively.

Figure 14:
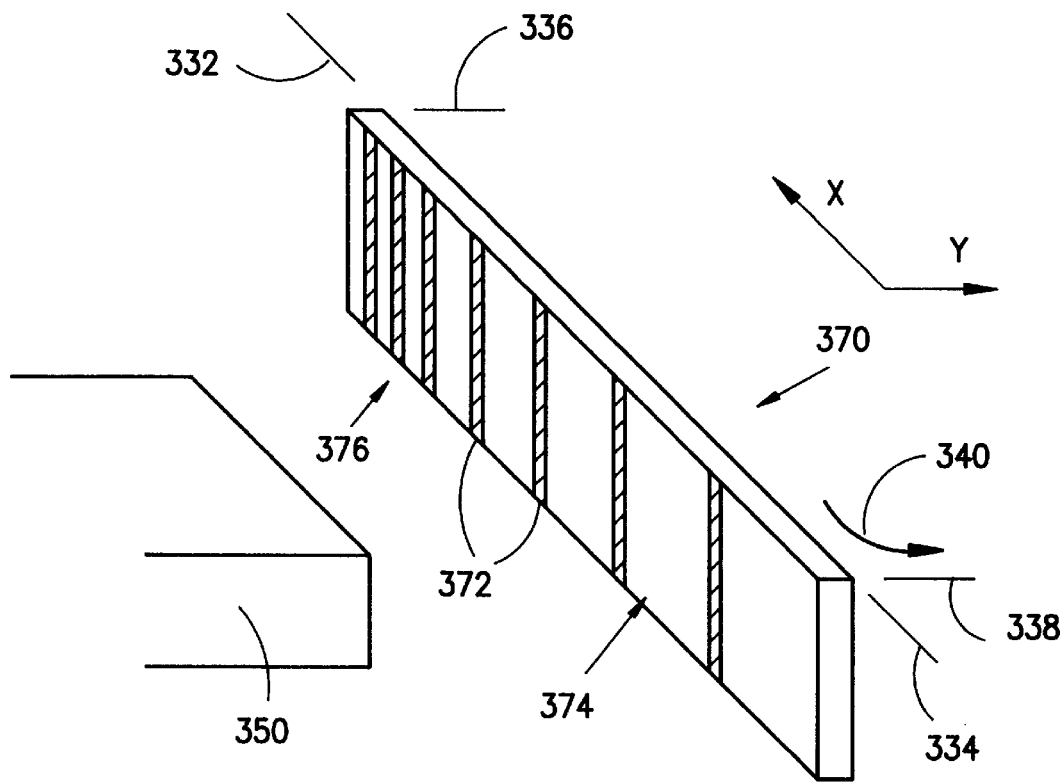
FIGS. 14 illustrates in diagrammatic form another embodiment of an optical grating, one which has a variable period.

FIG. 14 illustrates a released optical grating 370 having a varied spatial period. Grating lines 372 are silicon material between transparent SOG oxide regions, and vary in density across the face of the grating 370, being less dense in region 374 and more dense in region 376. Thus, moving the grating in the X direction will vary the period of the grating with respect to laser 350.

Figure 15:
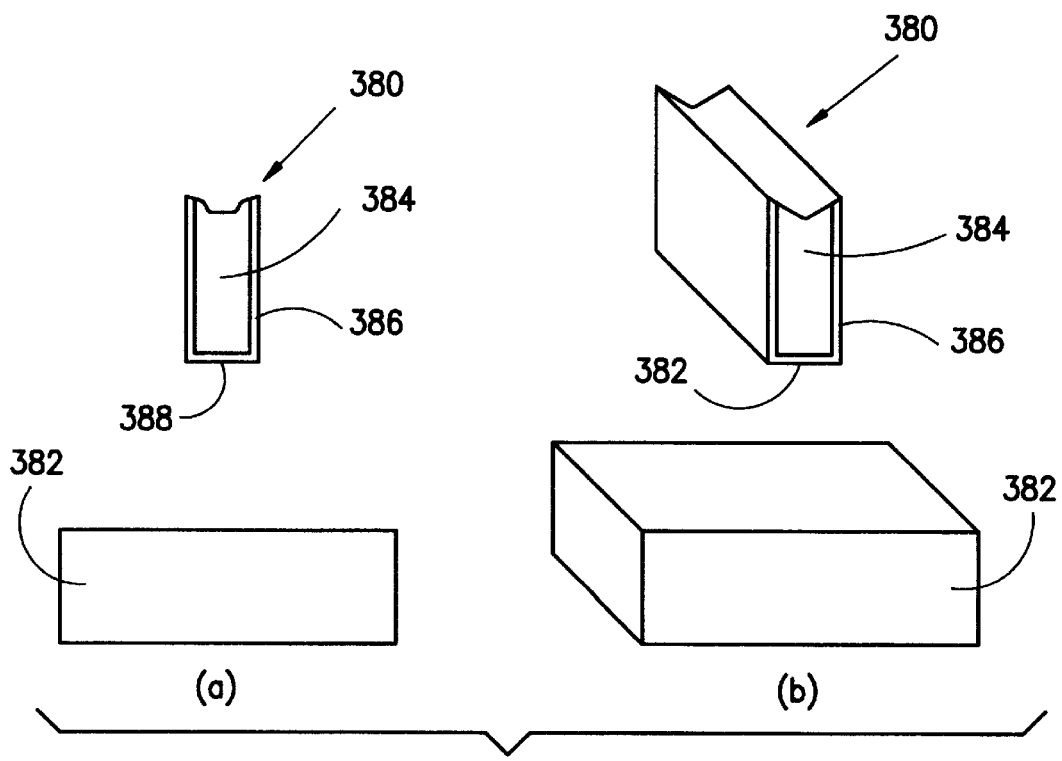
FIGS. 15a–b illustrate, in diagrammatic form, the last step in forming smooth-bottomed released structures.

FIGS. 15a and 15b illustrate a high aspect ratio released structure having a smooth bottom. The structure is formed without the need for a thick layer deposition. FIGS. 15a (a cross-section view) and 15b (a three dimensional view) illustrate only the last step in the process since the previous steps are exactly as those shown in FIGS. 1a–f. An $SF_6$ RIE is used to release the structure 380 from the silicon substrate 382. The structure has a SOG interior 384, bounded on it's sides 386 and bottom 388 by a CVD oxide layer, resulting in a very smooth bottom surface 388 on the structure.

Thus, it is evident that the present inventive trench-filling etch masking micro-fabrication technique opens up a tremendous area of exciting new applications. It utilizes the novel concept of using materials to fill up trenches which then serve as etch masks, allowing the formation of microstructures with topologies impractical using conventional technologies. The inventive process is a low temperature, low stress process resulting in ultra-high aspect ratio (100–200:1) structures.

Multiple level, ultra-high aspect ratio structures can be formed, each level independently controlled. For the first time, three dimensional linear actuators can be fabricated by following simple steps based on the present novel technique. In addition, ultra-high aspect ratio XYZ flexure structures can be formed without the need for complex lithography steps.

Although the invention has been described in terms of preferred embodiments, numerous modifications and variations will be evident to those of skill in the art. Accordingly, the true spirit and scope of the invention is limited only by the following claims.

What is claimed is:

1. A process for manufacturing submicron, ultra-high aspect ratio microstructures using a trench filling mask comprising the steps of:

etching at least one trench in a substrate to a depth equal to a predetermined desired mask height;

filling said at least one trench with a trench filling material;

planarizing said trench filling material to a level exposing a top surface of said substrate; and, etching said substrate wherein said trench filling material serves as an etch mask, preventing etching of said substrate immediately below said trench filling material.

2. The process of claim 1 further comprising the additional step of etching said substrate to undercut beneath said etch mask to form a free-standing structure.

3. The process of claim 2 further comprising the additional step of applying a metallization layer on said free-standing structure.

4. A process for manufacturing submicron, ultra-high aspect ratio microstructures using trench filling masks of differing heights comprising the steps of:

etching a first trench into a substrate to a depth equal to a first predetermined desired mask height;

etching a second trench into said substrate to a depth equal to a second predetermined desired mask height;

filling said first and second trenches with a trench filling material;

planarizing said trench filling material to a level exposing a top surface of said substrate; and, etching said substrate wherein said trench filling material serves as an etch mask, preventing etching of said substrate immediately below said trench filling material.

5. The process of claim 4 further comprising the additional step of etching said substrate to undercut beneath said first and second etch masks to form free-standing first and second structures.

6. A process for manufacturing submicron, ultra-high aspect ratio microstructures using a trench filling mask formed below the surface of a substrate within a trench comprising the steps of:

etching a first trench having a bottom and sidewalls into a substrate;

etching a second trench within said first trench;

filling said second trench with a trench filling material;

planarizing said trench filling material to a level exposing said bottom of said first trench; and, etching said substrate wherein said trench filling material serves as an etch mask, preventing etching of said substrate immediately below said trench filling material.

* * * * *